(12) United States Patent
Oka

(10) Patent No.: US 6,366,175 B2
(45) Date of Patent: Apr. 2, 2002

(54) TEMPERATURE COMPENSATED OSCILLATOR, METHOD OF CONTROLLING TEMPERATURE COMPENSATED OSCILLATOR, AND WIRELESS COMMUNICATION DEVICE

(75) Inventor: Manabu Oka, Minowa-machi (JP)

(73) Assignee: Seiko Epson Corporation, Tokyo (JP)

( * ) Notice: Subject to any disclaimer, the term of this patent is extended or adjusted under 35 U.S.C. 154(b) by 0 days.

(21) Appl. No.: 09/729,338

(22) Filed: Dec. 5, 2000

(30) Foreign Application Priority Data

Dec. 6, 1999  (JP) ............................. 11-346499
Aug. 7, 2000  (JP) ........................ 2000-239003

(51) Int. Cl.[7] ............................. H03B 5/04; H03B 5/32; H03B 5/36
(52) U.S. Cl. ..................... 331/116 R; 331/66; 331/158; 331/177 V
(58) Field of Search ........................ 331/65, 66, 116 R, 331/116 FE, 116 M, 158, 176, 177 V

(56) References Cited

U.S. PATENT DOCUMENTS 5,668,506 A * 9/1997 Watanabe et al. ............. 331/66

FOREIGN PATENT DOCUMENTS

| JP | 60-82845 | 6/1985 |
|---|---|---|
| JP | 60-154716 | 8/1985 |
| JP | 6-29742 | 2/1994 |
| JP | 6-303035 | 10/1994 |
| JP | 11-251836 | 9/1999 |

* cited by examiner

*Primary Examiner*—David Mis
(74) *Attorney, Agent, or Firm*—Oliff & Berridge, PLC

(57) ABSTRACT

A temperature compensated oscillator, a method of controlling a temperature compensated oscillator, and a wireless communication device are provided, where phase noise of the output signal can be reduced, frequency of the output signal stabilizes within a short time, and response of control does not become worse. Accordingly, a filter circuit is provided that removes noise contained in a temperature compensation voltage. A switching circuit is connected in parallel to this filter circuit. A power control circuit controls power supply to a voltage controlled oscillation circuit 28 and the like. The power control circuit turns on the switching circuit for a specified period when power supply to the voltage controlled oscillation circuit is started.

32 Claims, 20 Drawing Sheets

[Figure 1]
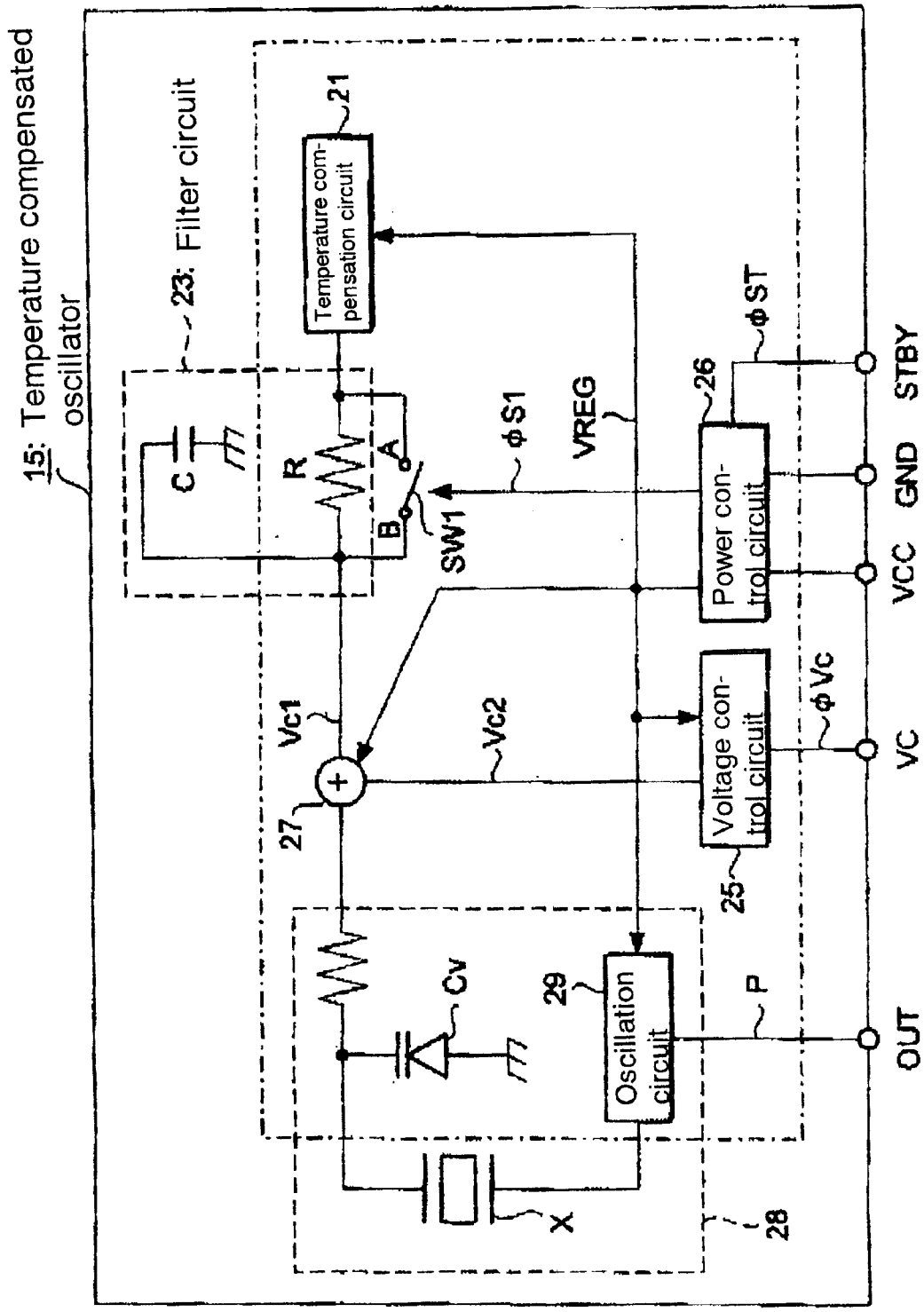

[Figure 2]
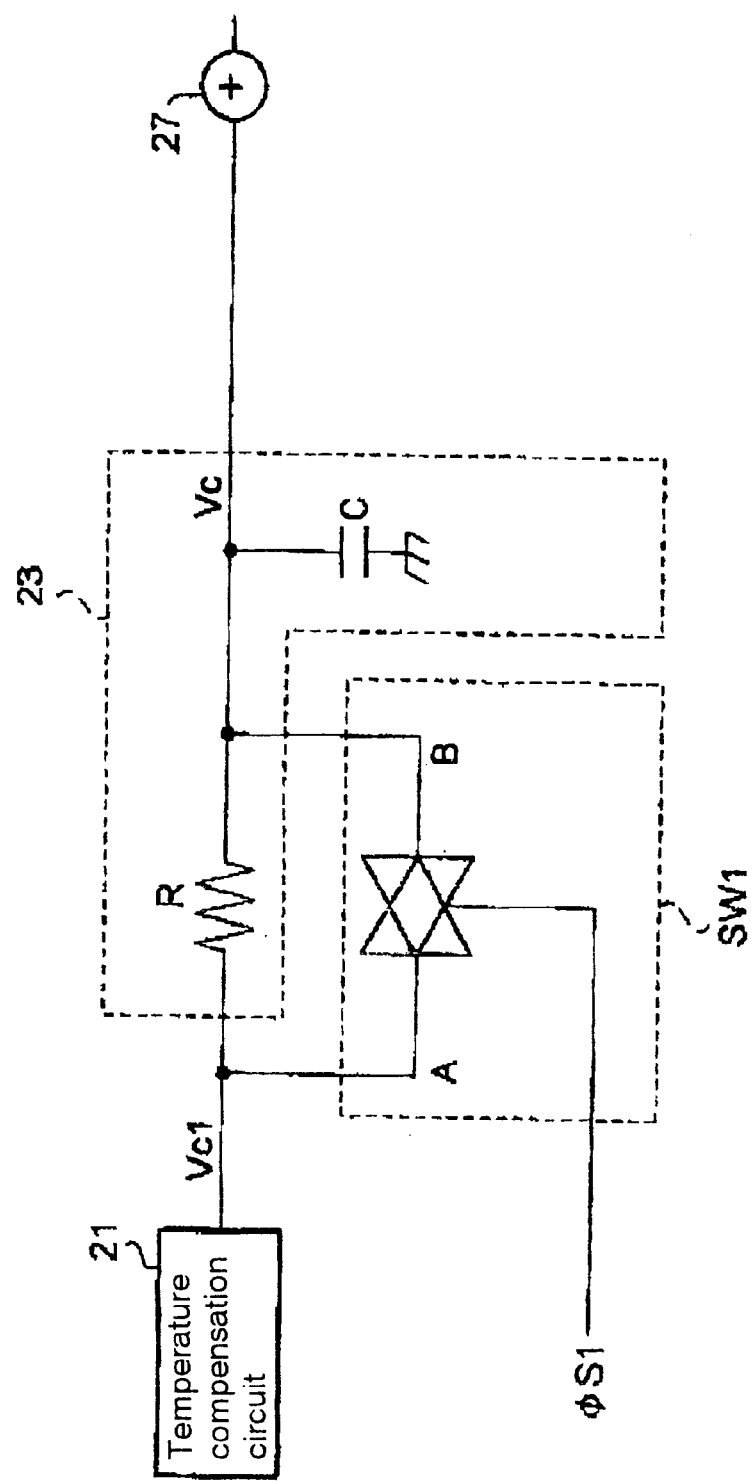

[Figure 3]
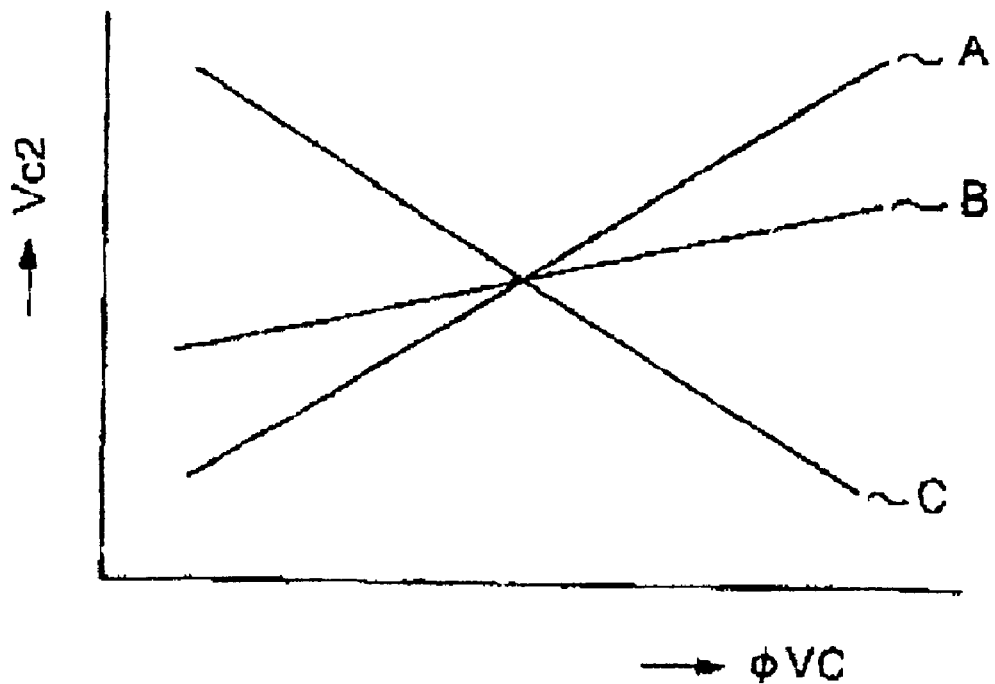

[Figure 4]
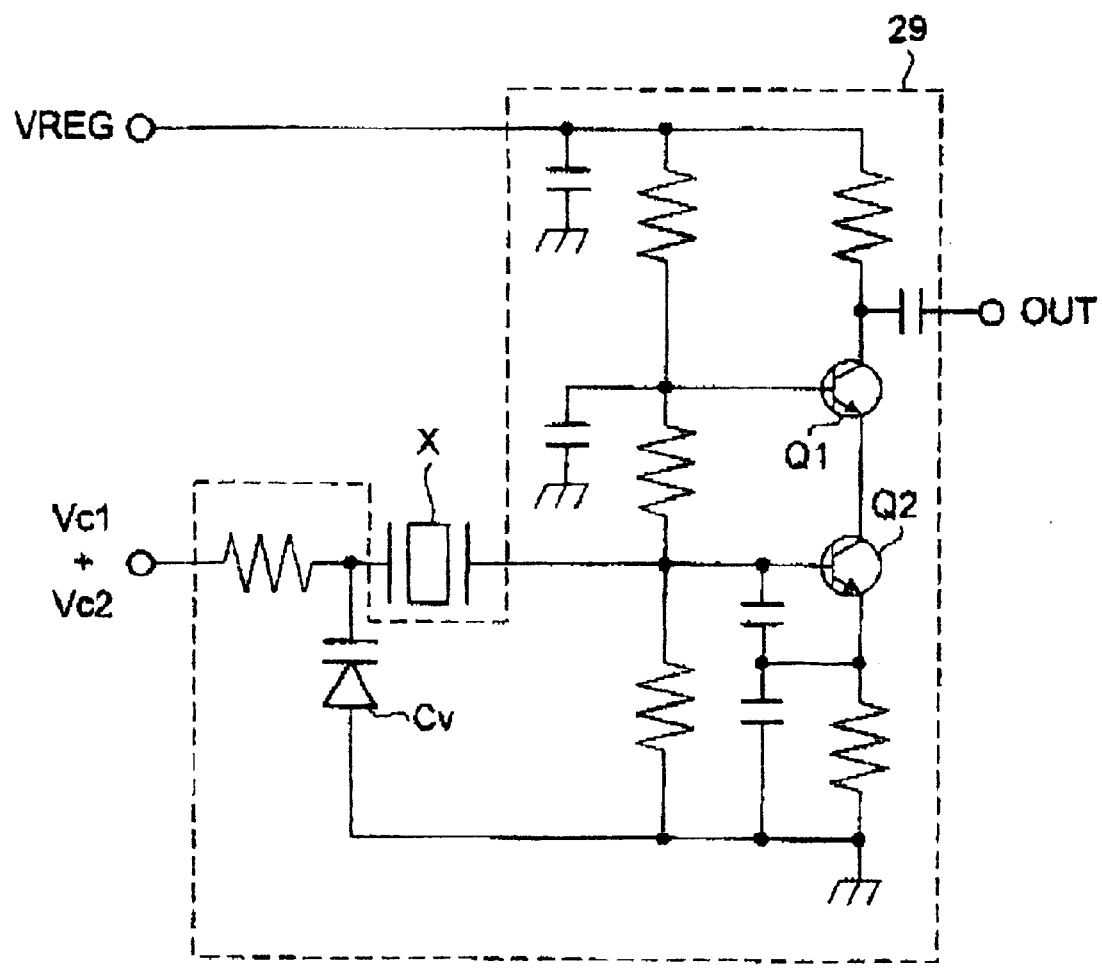

[Figure 5]
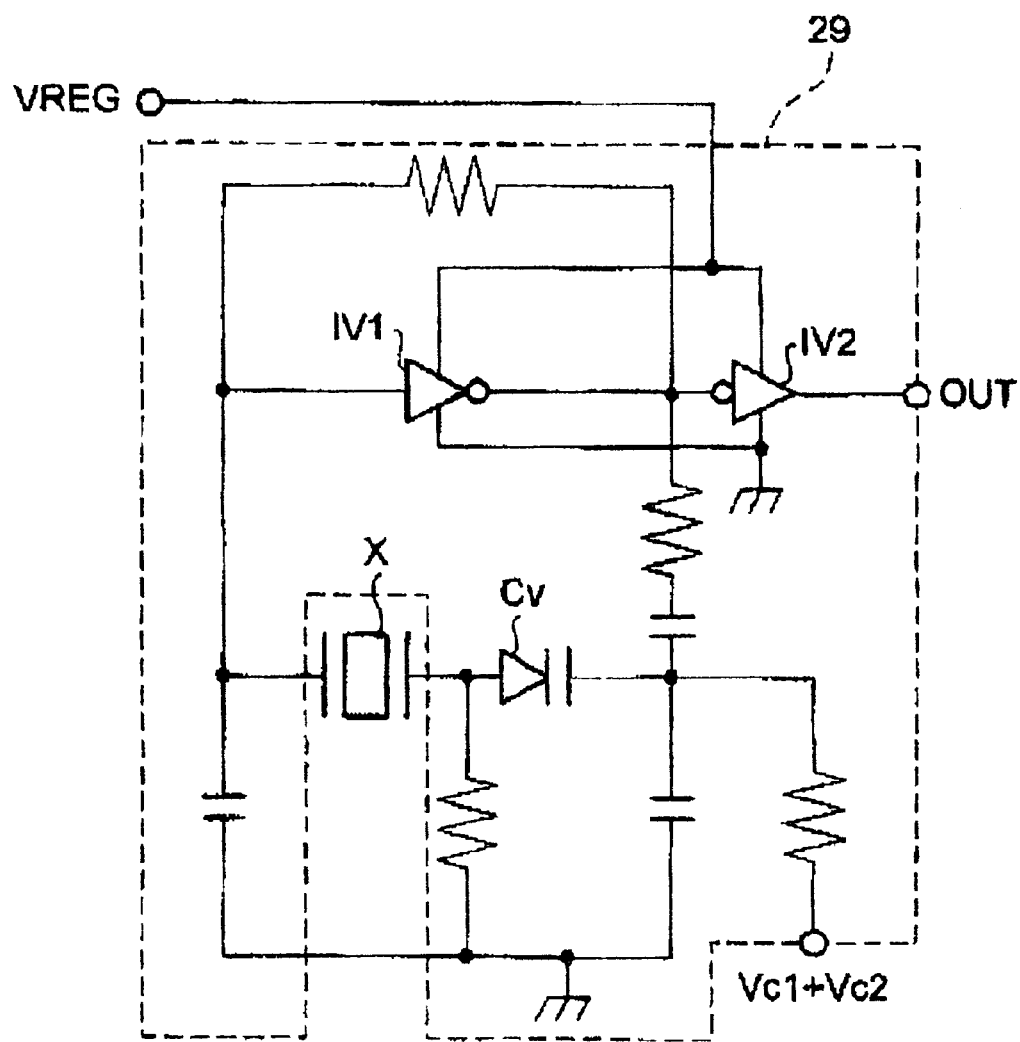

[Figure 6]
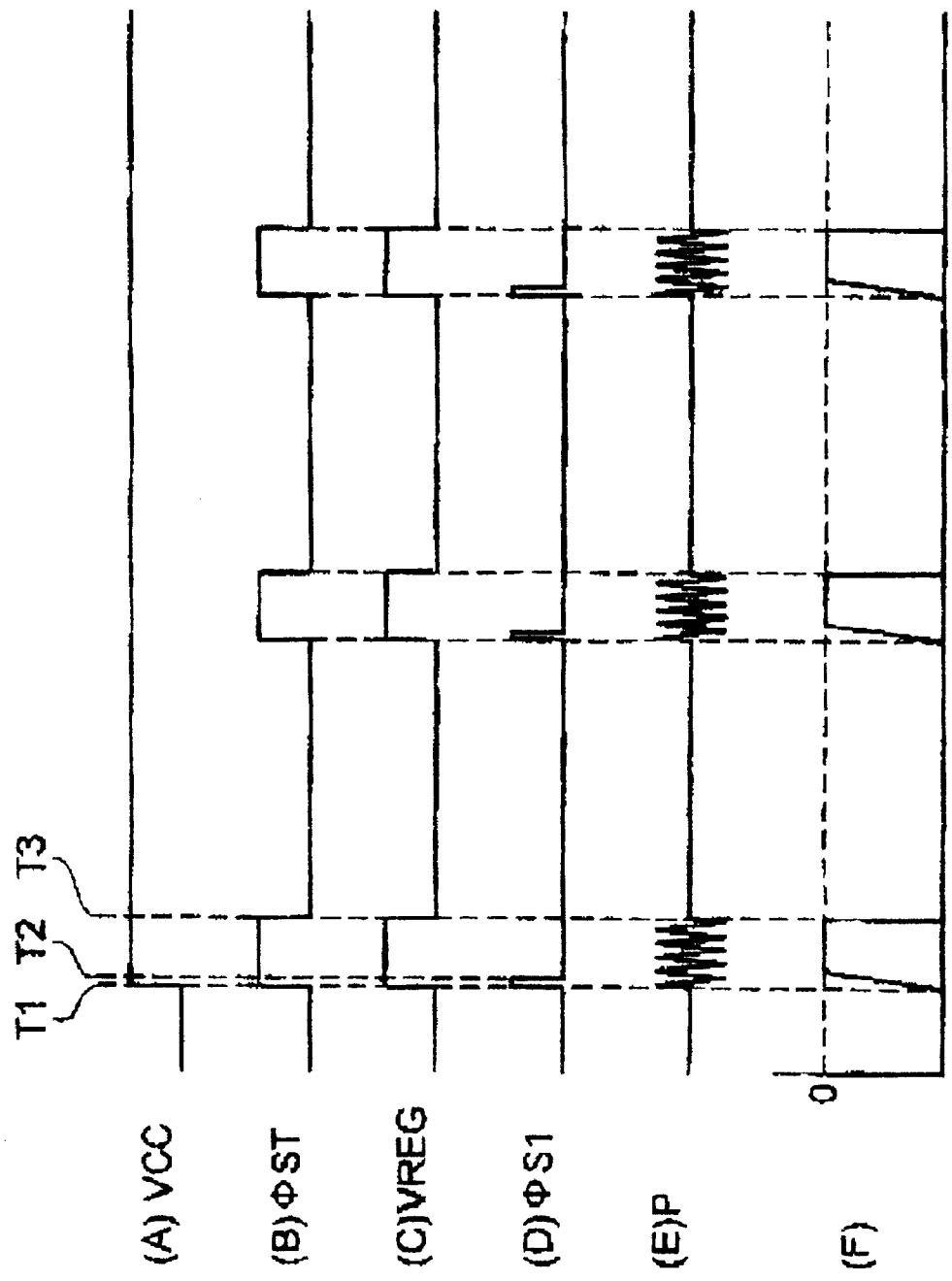

[Figure 7]
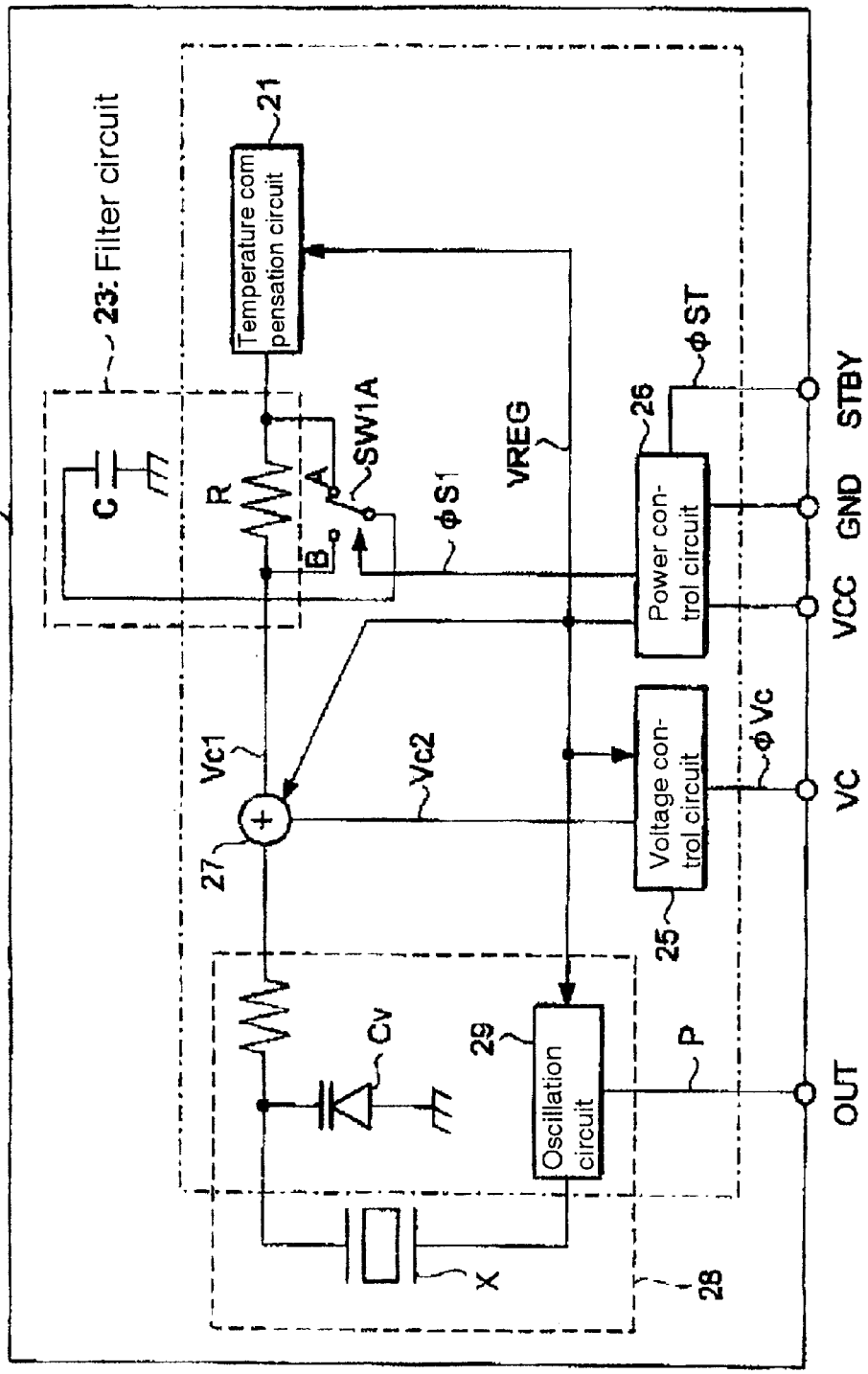

[Figure 8]
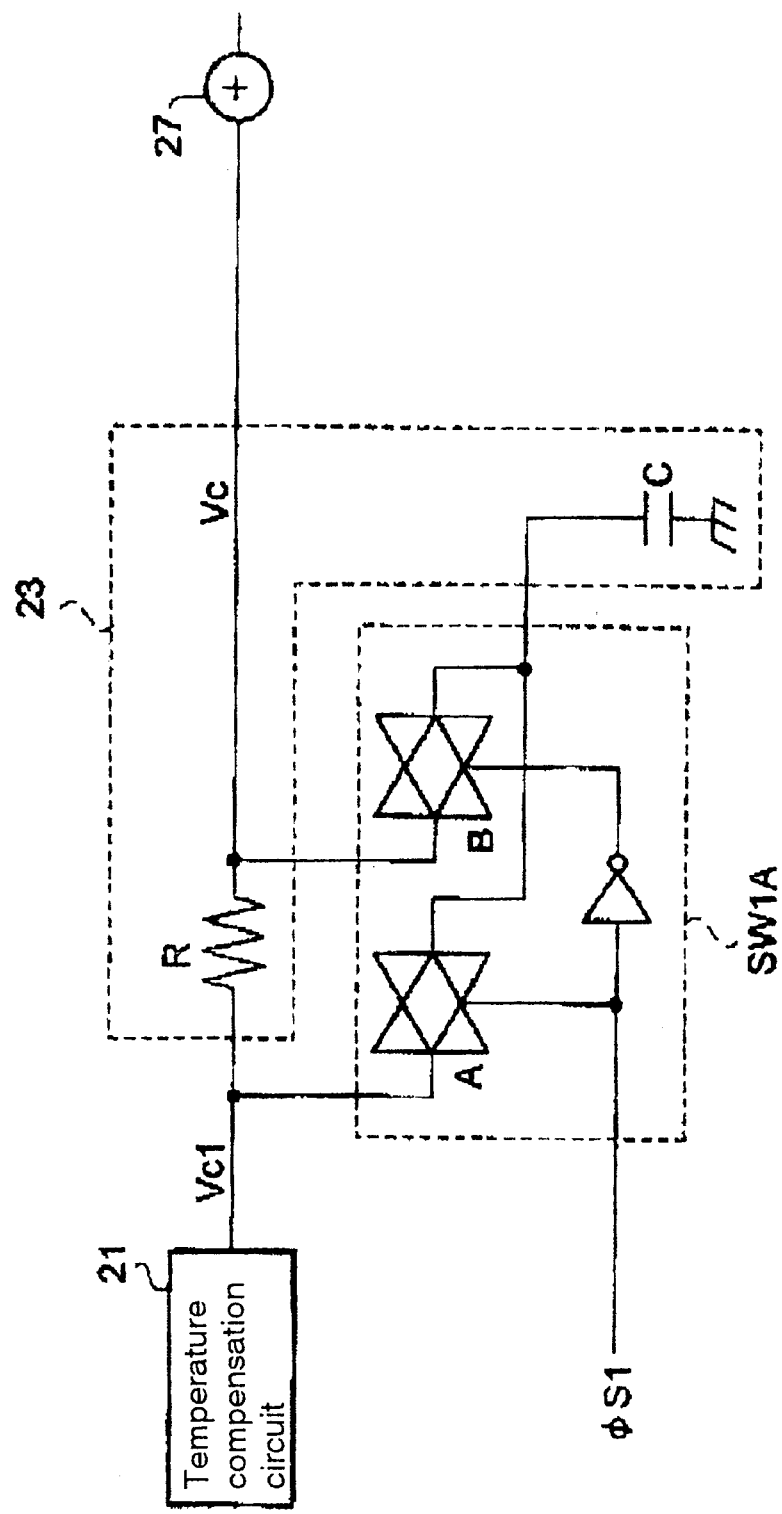

[Figure 9]
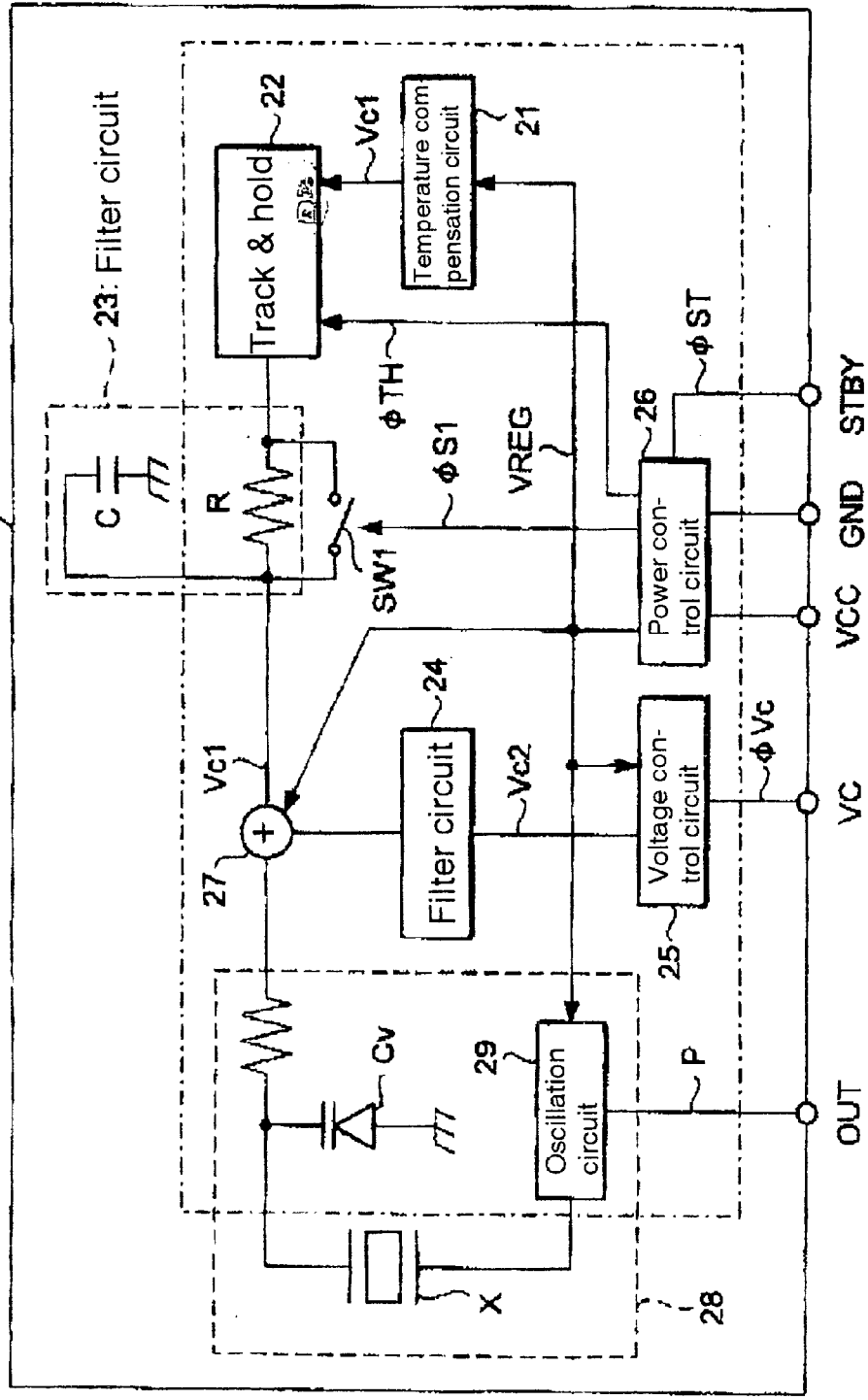

[Figure 10]
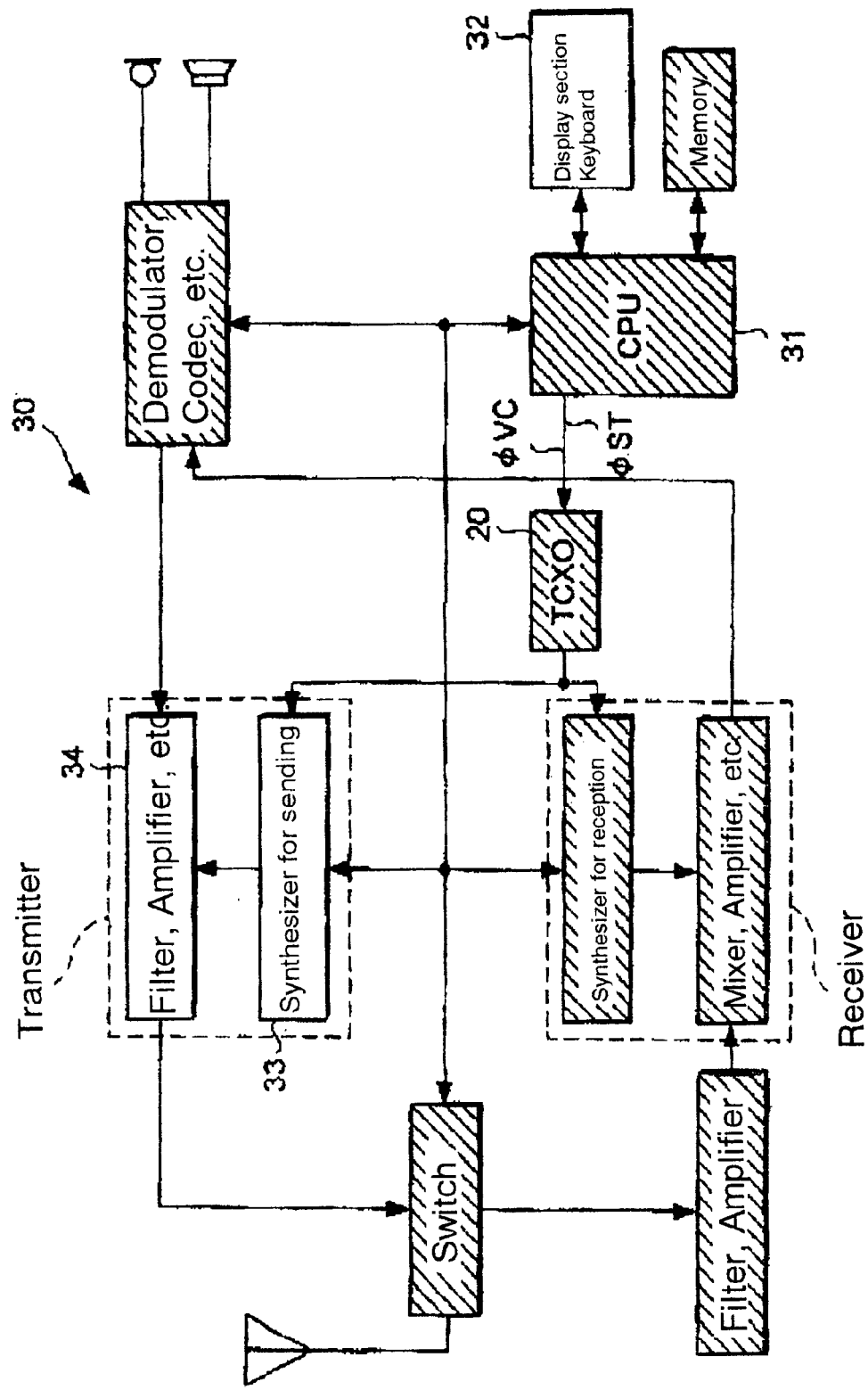

[Figure 11]
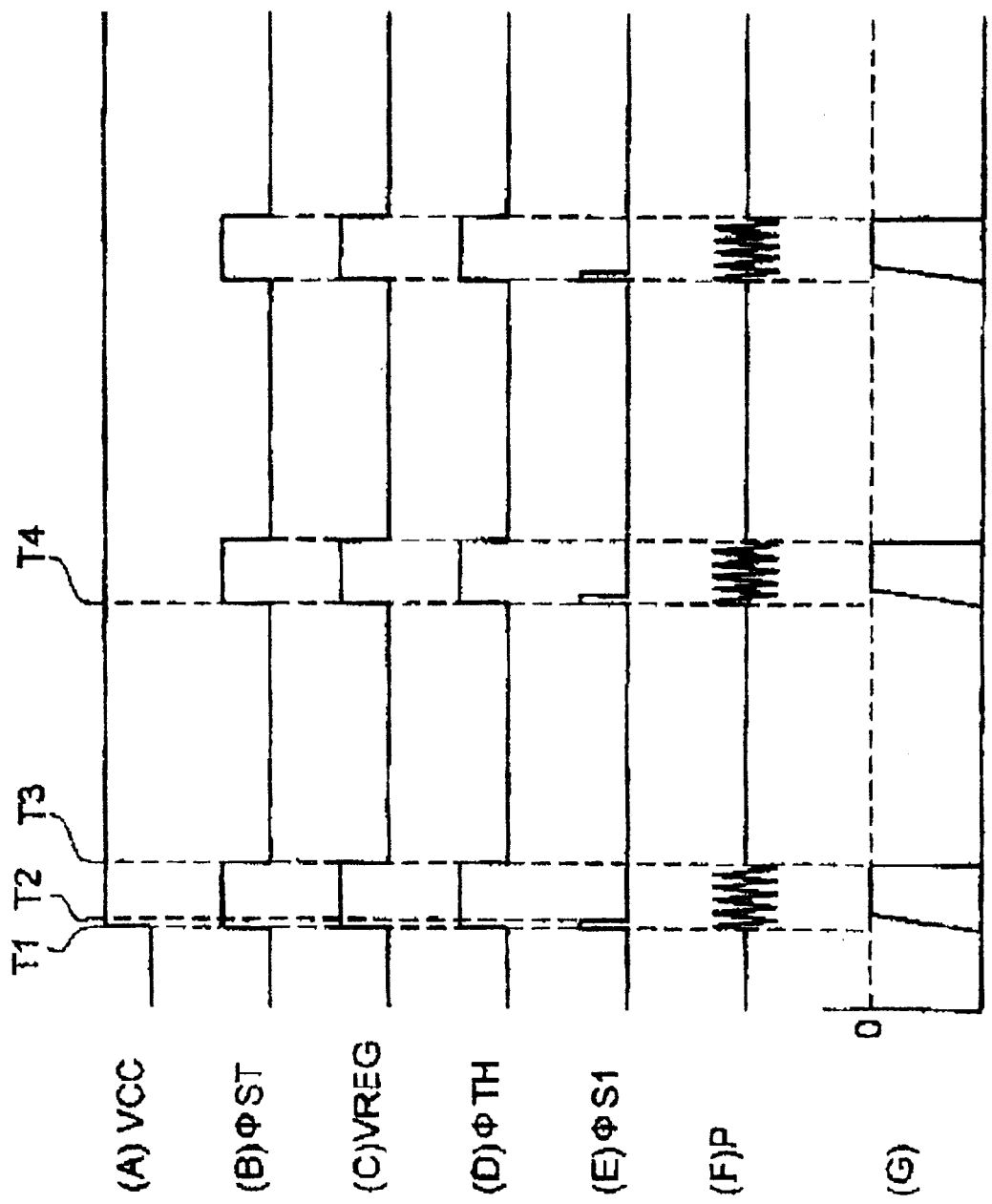

[Figure 12]
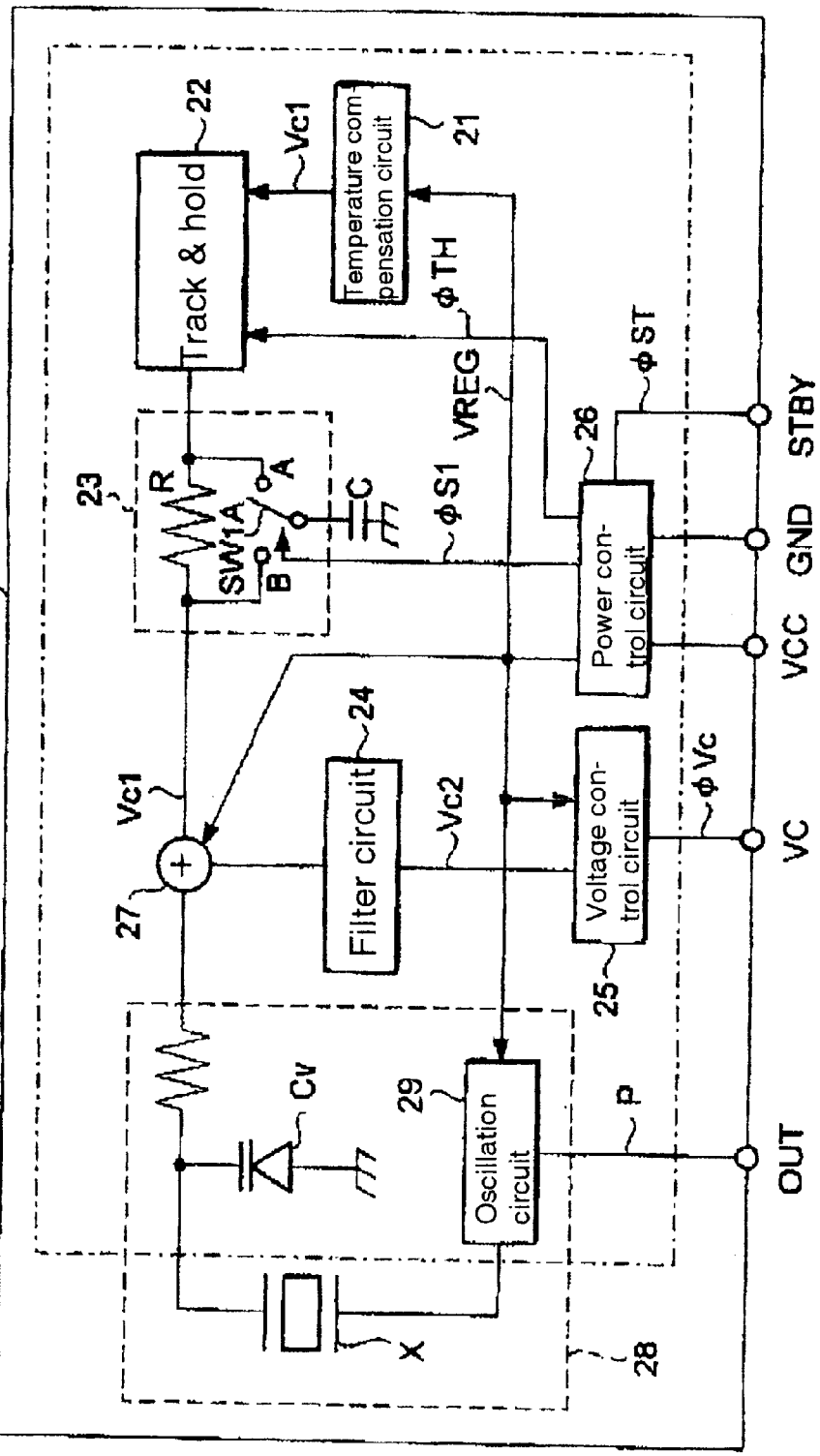

[Figure 13]
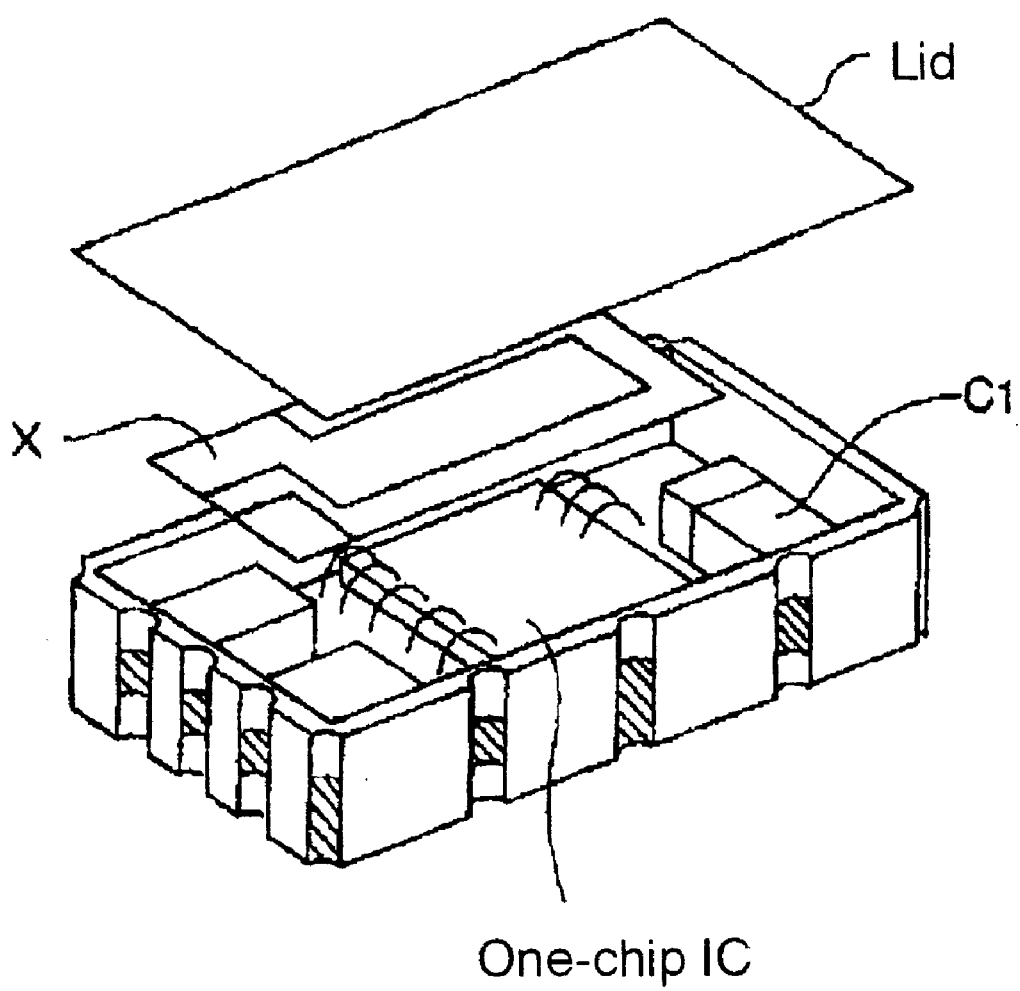

[Figure 14]
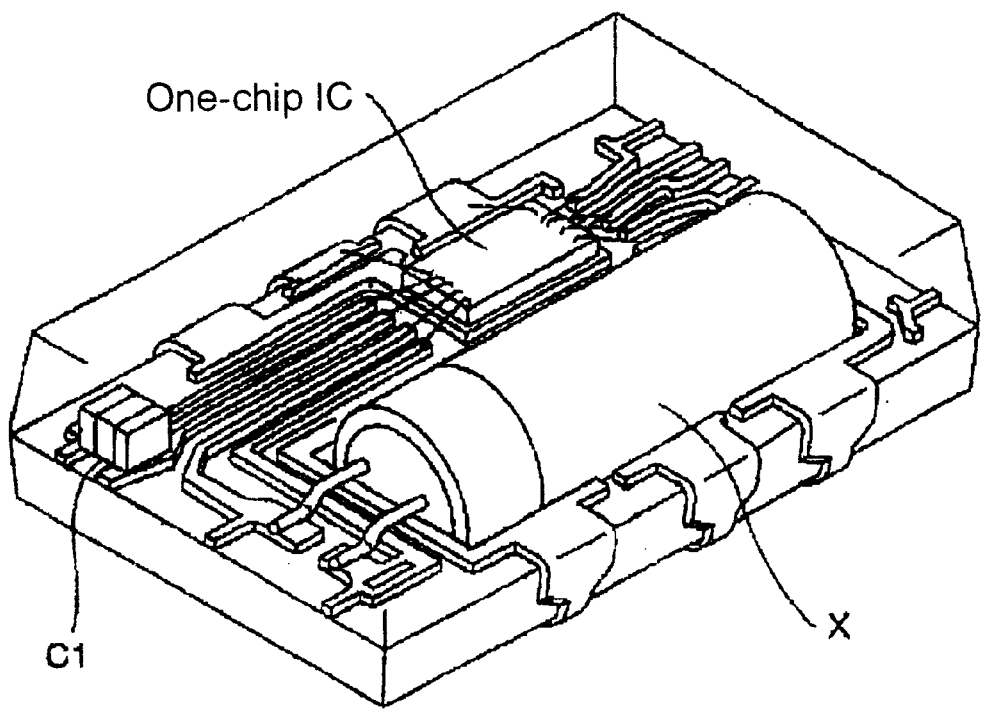

[Figure 15]
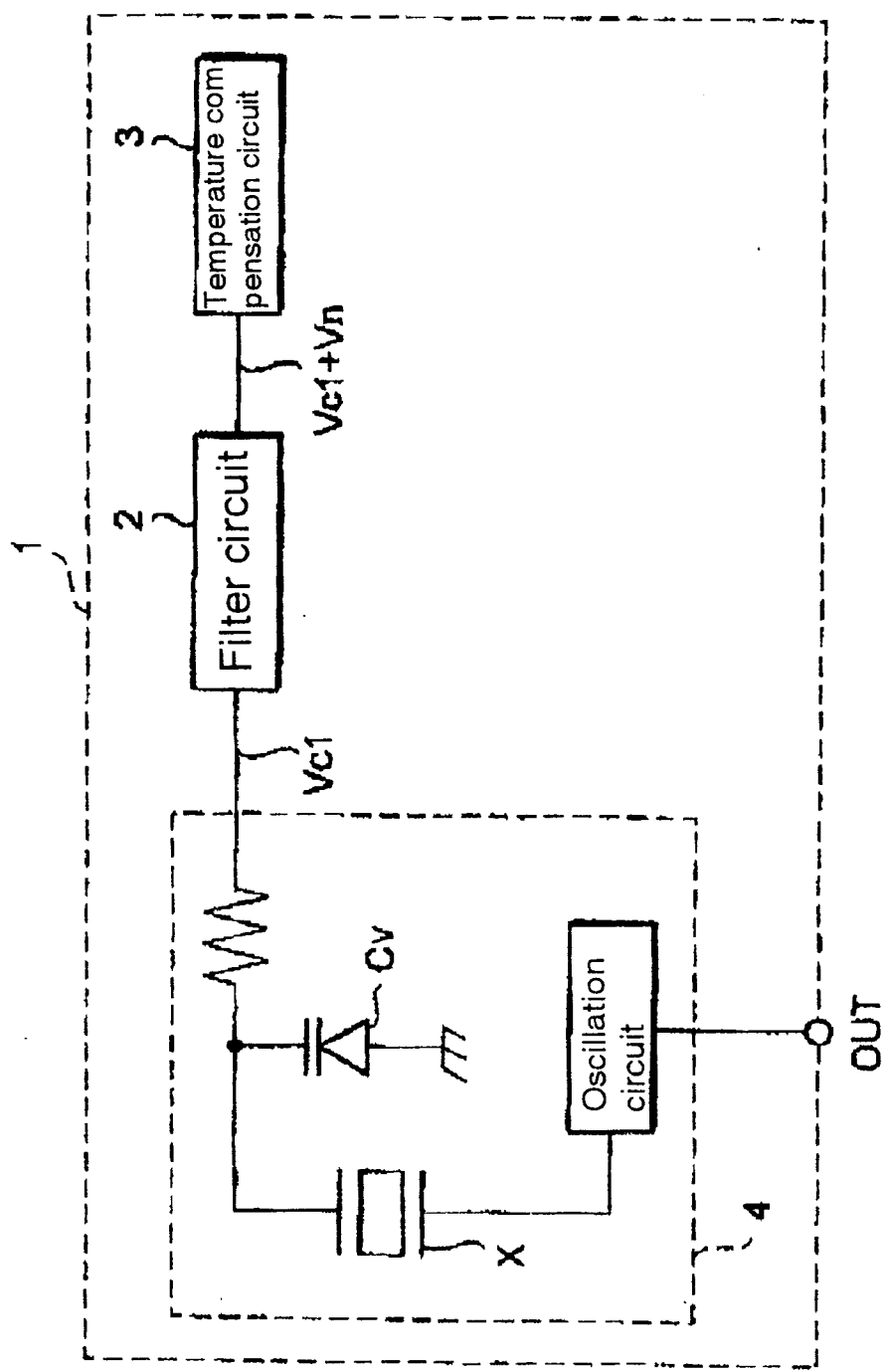

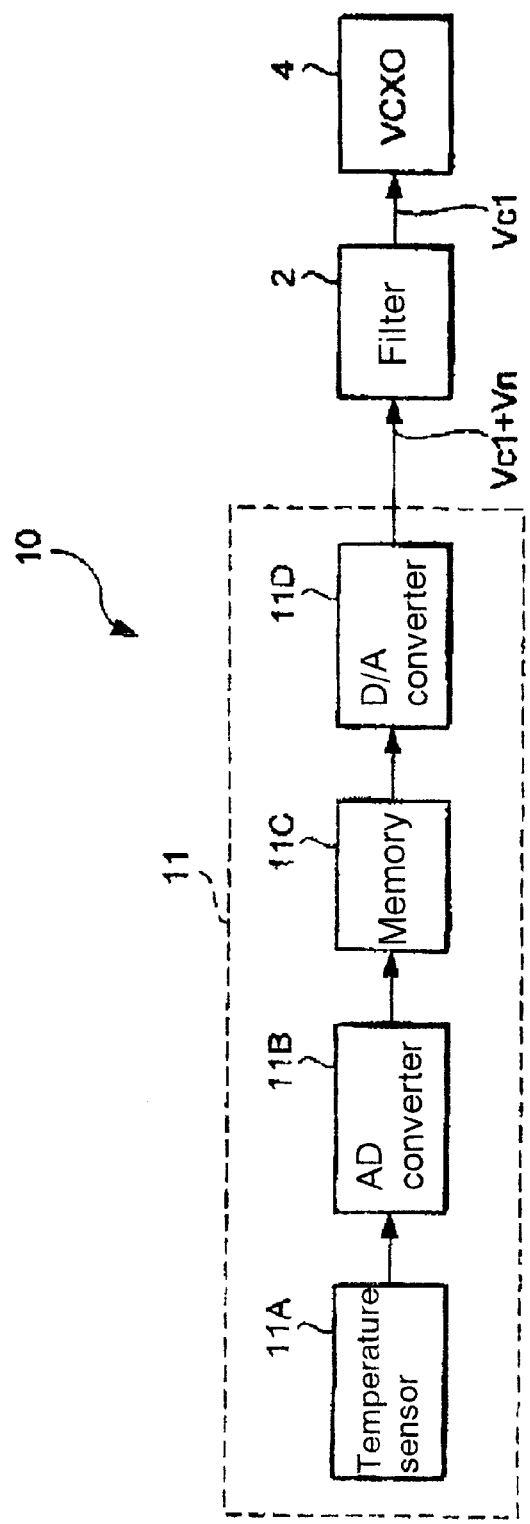
[Figure 16]

[Figure 17]
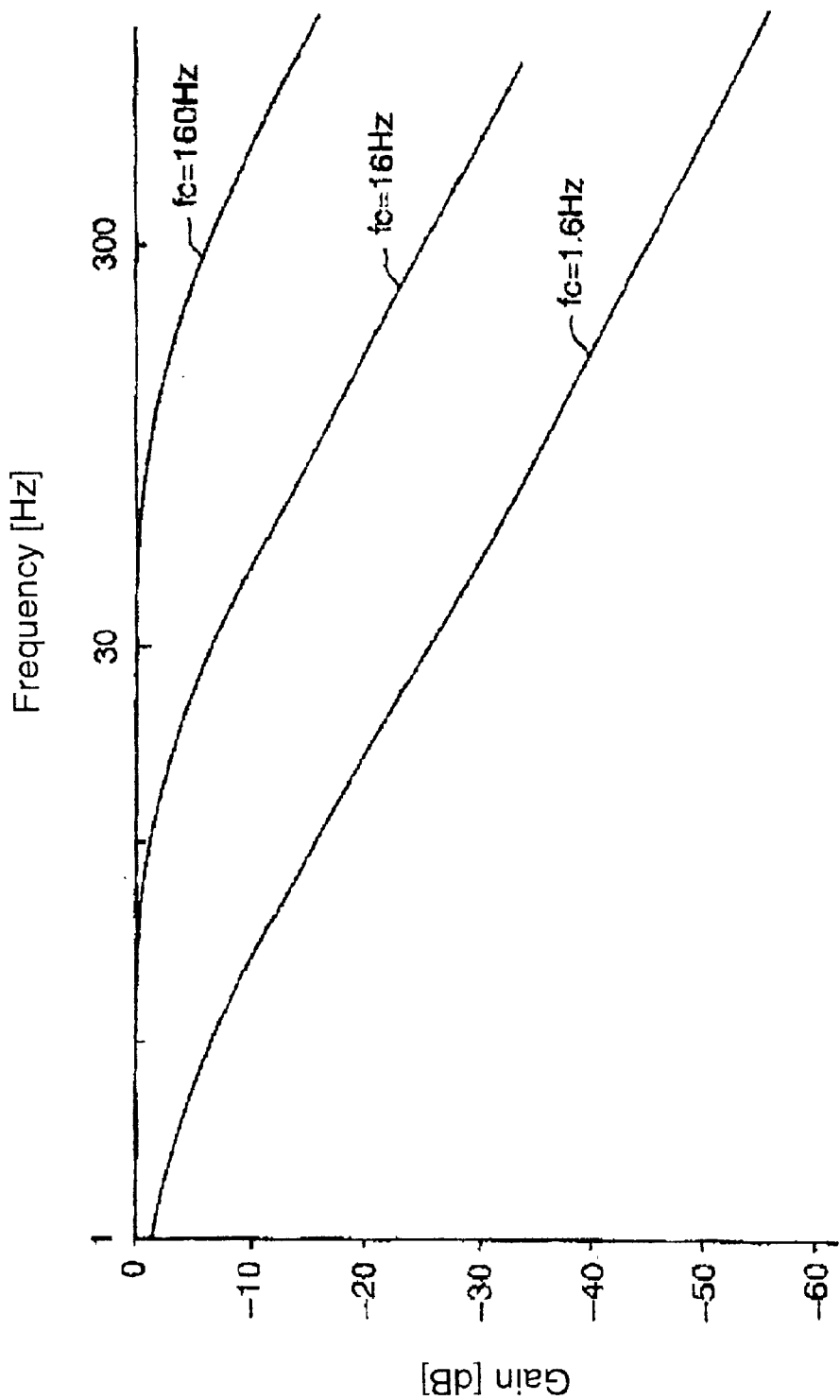

[Figure 18]
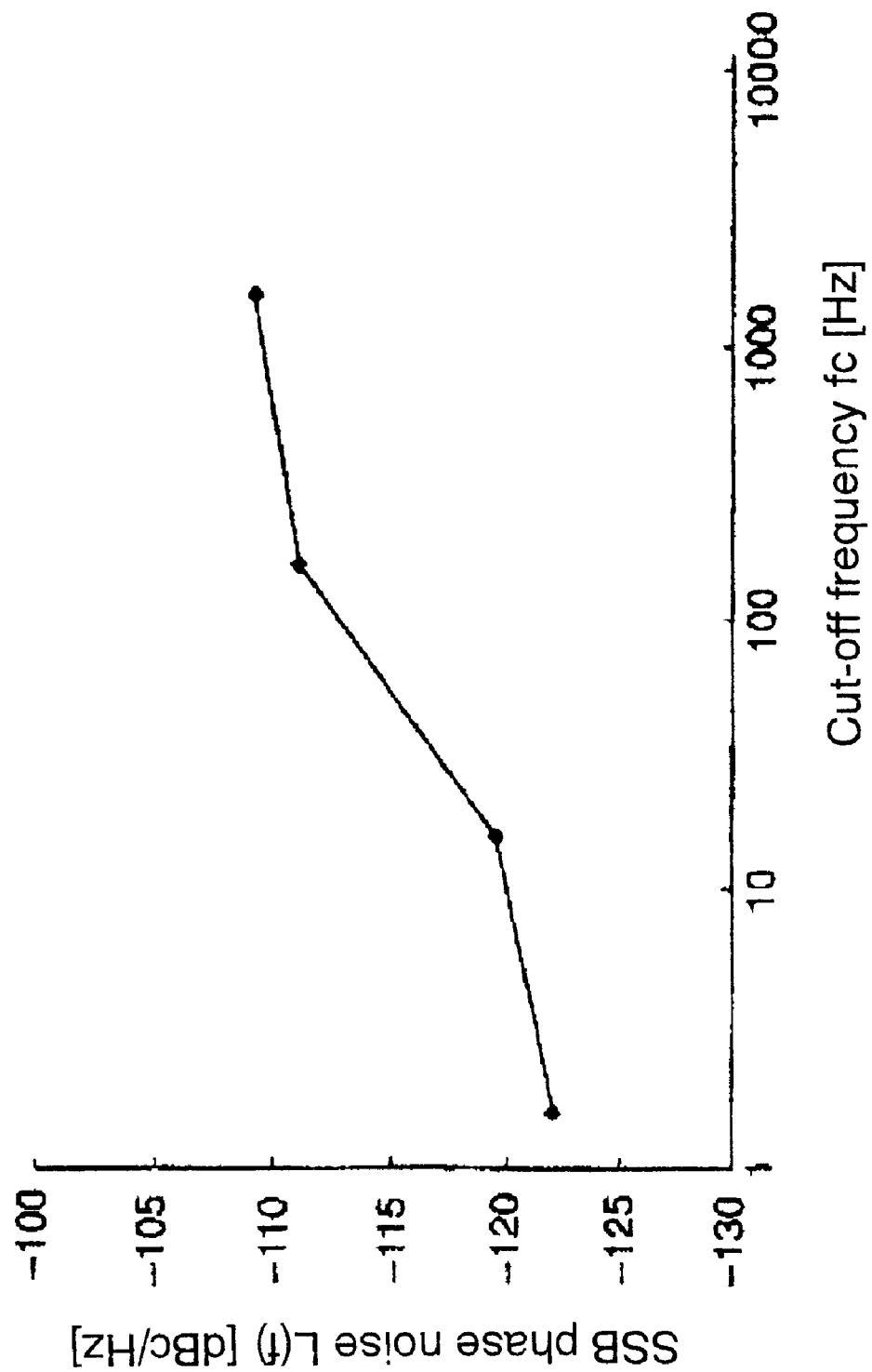

[Figure 19]
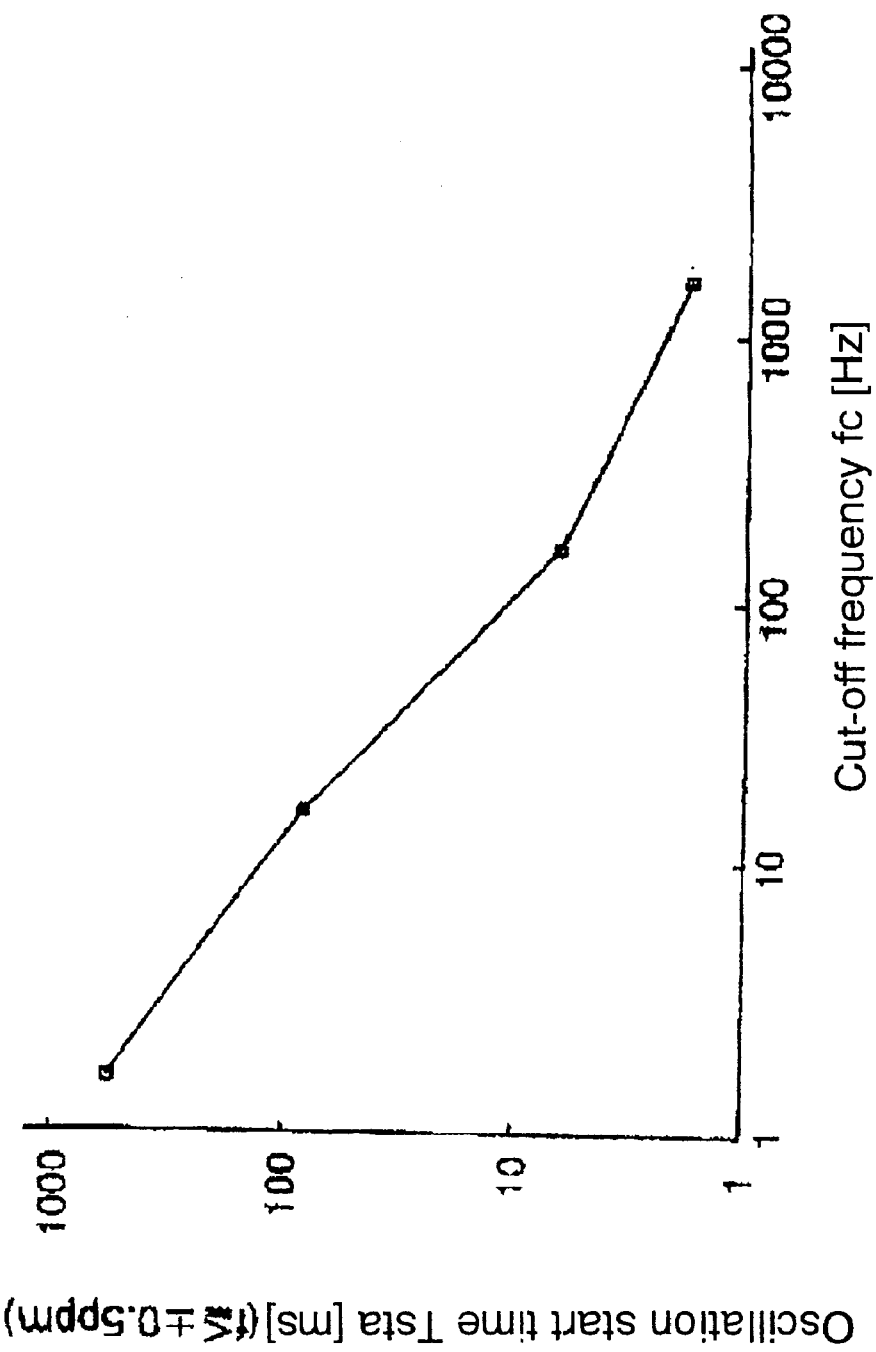

[Figure 20]
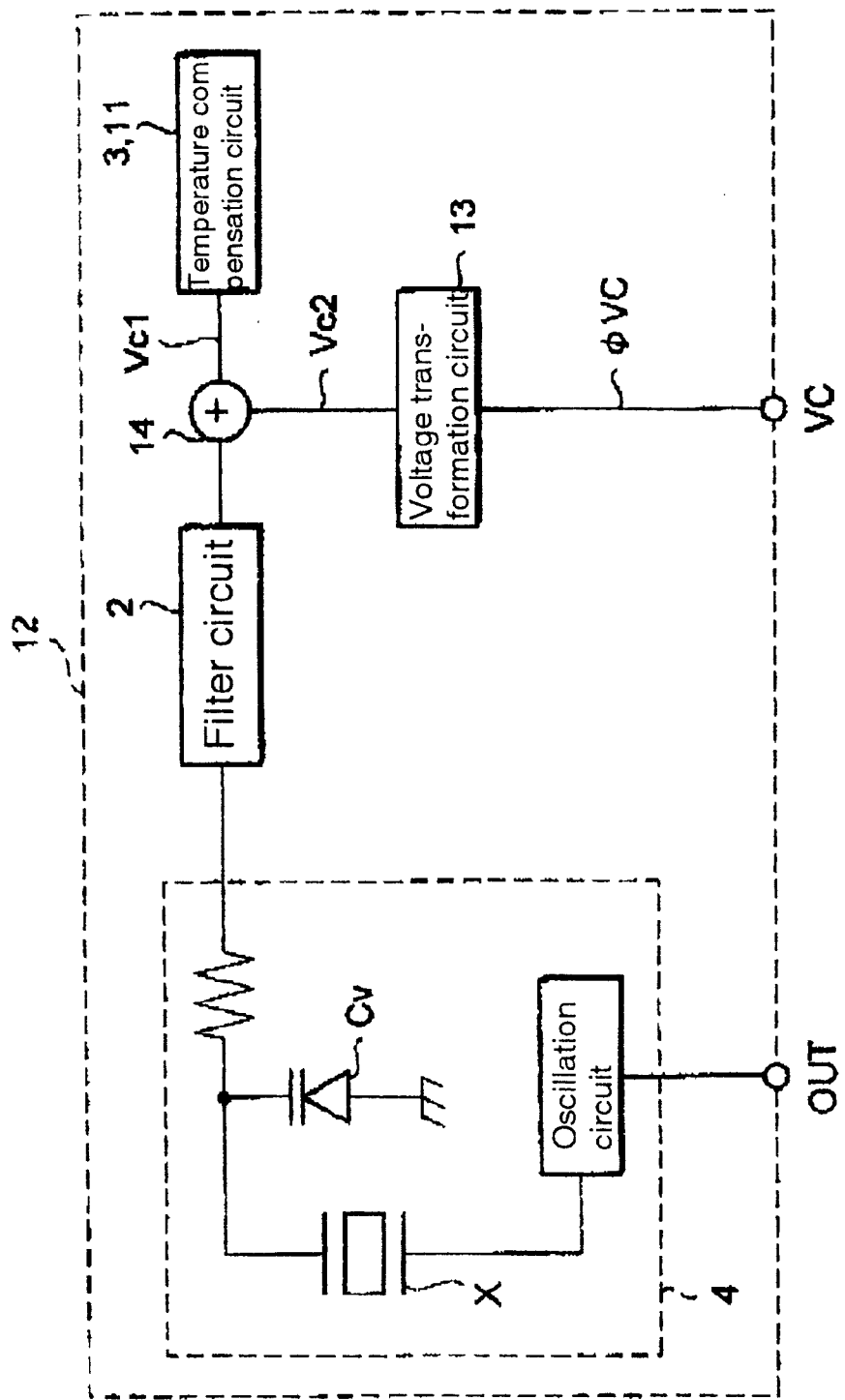

TEMPERATURE COMPENSATED OSCILLATOR, METHOD OF CONTROLLING TEMPERATURE COMPENSATED OSCILLATOR, AND WIRELESS COMMUNICATION DEVICE

BACKGROUND OF THE INVENTION

1. Field of Invention

This invention relates to a temperature compensated oscillator, a control method for a temperature compensated oscillator, and a wireless communication device.

2. Description of Related Art

Conventionally, as oscillators used for electronic equipment, such as wireless communication devices, a temperature compensated oscillator (TCXO) is used because the output of frequency signals needs to be stable over a wide temperature range.

This temperature compensated oscillator utilizes the fact that oscillation frequency of a piezoelectric resonator changes according to the load capacity in order to maintain the oscillation frequency constant through a temperature compensation circuit in which the load capacity is varied according to temperature.

Also, among the temperature compensated oscillators, there are analog oscillators where the temperature compensation circuit is constructed by an analog circuit, and digital oscillators where the temperature compensation circuit is constructed by a digital circuit.

In an analog temperature compensated oscillator, because the temperature compensated circuit consists of many resistor elements and semiconductor elements, noise Vn is added to the temperature compensation voltage Vc1 output by the temperature compensation circuit due to thermal noise, shot noise, and the like.

Therefore, in the analog temperature compensated oscillator shown in FIG. 15, by inserting a filter circuit 2 that removes the high-frequency component between a temperature compensation circuit 3 and a voltage controlled oscillation circuit 4, noise Vn can be removed from the output voltage Vc1+Vn of the temperature compensation circuit 3.

In this way, by installing the filter circuit 2 that removes noise contained in the temperature compensation voltage Vc1 output from the temperature compensation circuit 3, phase noise of the output signal is reduced.

FIG. 16 is a block diagram of a digital temperature compensated oscillator.

In a digital temperature compensated oscillator 10, a temperature compensation circuit 11 consists, for example, of a temperature sensor 11A, an analog/digital (A/D) converter 11B, a memory 11C, and a digital/analog (D/A) converter 11D.

In the temperature compensation circuit 11, temperature information measured by the temperature sensor 11A is converted from analog to digital by the A/D converter 11B, converted to digital signal for compensating the temperature property of a piezoelectric resonator X memorized in advance in the memory 11C, converted from digital to analog by the D/A converter 11D, and output as temperature compensation voltage Vc1.

In this case, if any change occurs to the digital signal input to the D/A converter 11D due to temperature change, step-shape noise Vn occurs to the temperature compensation voltage Vc1 due to influence of resolution of the D/A converter 11D.

Because of this, as shown in FIG. 16, by inserting the filter circuit 2 that removes the high-frequency component between the temperature compensation circuit 11 and the voltage controlled oscillation circuit (VCXO) 4, noise Vn is removed from the temperature compensation voltage Vc1.

Therefore, by using a filter circuit such as an analog one in a digital temperature compensated oscillator, phase noise of the output signal can be reduced.

SUMMARY OF THE INVENTION

As in a property curve of a filter circuit (LPF), such as that shown in FIG. 17, the larger the time constant, namely the lower the cut-off frequency fc, the more decline high frequency shows in a filter circuit.

Because of this, for reducing phase noise of output signals of a temperature compensated oscillator using a filter circuit, it is better to set the cut-off frequency fc of the filter circuit low. Here, shown in FIG. 18 is a property curve between the SSB phase noise at the detuning frequency and cut-off frequency fc of a filter circuit.

On the other hand, when power is supplied intermittently to a temperature compensated oscillator, from a power-saving point of view as in the standing-by time for a portable wireless communication device, reduction of time from the oscillation start until the output frequency becomes stable (called "Oscillation starting time" below) is desired.

However, as in a property curve of the oscillation starting time shown in FIG. 19, the lower the cut-off frequency of a filter circuit is set, the longer the oscillation starting time Tsta becomes.

Because of this, in a temperature compensated oscillator, there is a problem that realization of both reduction of phase noise of the output signal and reduction of the oscillation starting time is difficult.

Also, as shown in FIG. 20, common as an oscillator of modem portable wireless communication devices is a VC-TCXO that is equipped with a frequency control voltage input terminal VC for the frequency adjustment function that adjusts the frequency even more precisely based on the signal from the base station.

Namely, as shown in FIG. 20, VC-TCXO 12 inputs a frequency control signal $\phi$VC supplied to a signal processing circuit of a portable wireless communication device based on the signal received from the base station, and converts the voltage of this frequency control signal $\phi$VC to a frequency control voltage Vc2 by a voltage conversion circuit 13.

Then, in VC-TCXO 12, the frequency control voltage Vc2 and temperature compensation voltage Vc1 are added by an adder 14 that is supplied to a voltage controlled oscillation circuit 4 via the filter circuit 2. By this, frequency of the output signal is temperature compensated and changed to the frequency synchronous to the base frequency of the base station.

In the circuit described above, if phase noise of the output signal is reduced using a filter circuit 2 with a large time constant, a problem also occurs in that response of the oscillation frequency to the frequency control voltage Vc2 is not good.

One objective of this invention is to at least provide a temperature compensated oscillator where phase noise of the output signal can be reduced, frequency of the output signal stabilizes in a short time, and response of the control is good. In accordance with various exemplary embodiments of this invention, a method of controlling and a wireless communication device equipped with this temperature compensated oscillator are provided.

In accordance with one exemplary embodiment of this invention, a temperature compensated oscillator is provided that has a voltage controlled oscillation circuit whose output signal oscillation frequency changes according to supplied voltage, and a temperature compensation circuit that outputs temperature compensation voltage for keeping the oscillation frequency of the output signal constant based on temperature.

filter circuit that removes noise contained in the temperature compensation voltage;

switching circuit connected in parallel with the filter circuit; and power control circuit that controls power supply at least to the voltage controlled oscillation circuit and the temperature compensation circuit, respectively, wherein the power control circuit turns on the switching circuit for a specified period when power supply to the voltage controlled oscillation circuit is started.

In accordance with another exemplary embodiment of this invention, a temperature compensated oscillator is provided that has a voltage controlled oscillation circuit whose output signal oscillation frequency changes according to supplied voltage and a temperature compensation circuit that outputs temperature compensation voltage for keeping the output signal oscillation frequency constant based on temperature, comprising;

filter circuit for removing noise contained in the temperature compensation circuit that is a low-pass filter where capacitance elements are connected in parallel to resistor elements via a switching circuit; and power control circuit that controls power supply at least to the voltage controlled oscillation circuit and the temperature compensation circuit, respectively, wherein the switching circuit is circuit for switching the connection locations of one end of all of the capacitance elements between the temperature compensation voltage output side and the temperature compensation voltage input side of the resistor elements, and the power control circuit connects by the switching circuit one end of the capacitance elements to the temperature compensation voltage input side of the resistor elements when power supply to the voltage controlled oscillation circuit is started and to the temperature compensation voltage output side of the resistor elements after a specified period has passed.

In accordance with another exemplary embodiment of this invention, a temperature compensated oscillator is provided that has a voltage controlled oscillation circuit whose output signal oscillation frequency changes according to supplied voltage and a temperature compensation circuit that outputs temperature compensation voltage for keeping the output signal oscillation frequency constant based on temperature. The temperature compensated oscillator may include a filter circuit that removes noise contained in the temperature compensation circuit that is a plurality of stages of low-pass filters where capacitance elements are connected in parallel to resistor elements via a switching circuit, and a power control circuit that controls power supply at least to the voltage controlled oscillation circuit and the temperature compensation circuit, respectively. The switching circuit is a circuit for switching the connection locations of one end of all of the capacitance elements between the temperature compensation voltage output side of each corresponding resistor element and the temperature compensation voltage input side of the resistor element closest to the temperature compensation circuit among all of the resistor elements. The power control circuit connects, by the switching circuit, one end of all of the capacitance elements to the temperature compensation voltage input side of the resistor element closest to the temperature compensation circuit when power supply to the voltage controlled oscillation circuit is started, and to the temperature compensation voltage output side of each corresponding resistor element after a specified period has passed.

In accordance with another exemplary embodiment of this invention, in the temperature compensated oscillator described above, inductance elements are used in place of the resistor elements in the filter circuit.

In accordance with another exemplary embodiment of this invention, the temperature compensated oscillator described above has an output switching circuit between the temperature compensation circuit and the filter circuit which can switch between a first mode where the output voltage follows the temperature compensation voltage, and a second mode where the output voltage is maintained at the temperature compensation voltage of the mode switching time. The power control circuit switches the output switching circuit to the first mode when power supply to the temperature compensation circuit is started and the output switching circuit to the second mode when power supply to the temperature compensation circuit is stopped.

In accordance with another exemplary embodiment of this invention, a temperature compensated oscillator is provided that has a voltage controlled oscillation circuit whose output signal oscillation frequency changes according to supplied voltage and a temperature compensation circuit that outputs temperature compensation voltage for keeping the output signal oscillation frequency constant based on temperature. The temperature compensated oscillator may include anoutput switching circuit which can switch between a first mode where the output voltage follows the temperature compensation voltage, and a second mode where the output voltage is maintained at the temperature compensation voltage of the mode switching time, a filter circuit that removes noise contained in the temperature compensation voltage output via the output switching circuit, and a power control circuit that controls power supply at least to the voltage controlled oscillation circuit and the temperature compensation circuit, respectively. The power control circuit switches the output switching circuit to the first mode when power supply to the temperature compensation circuit is started, and to the second mode when power supply to the temperature compensation circuit is stopped.

In accordance with another exemplary embodiment of this invention, in the temperature compensated oscillator described above, the power control circuit stops power supply to the circuits, except the output switching circuit, when power supply to the voltage controlled oscillator and the temperature compensation circuit are stopped.

In accordance with another exemplary embodiment of this invention, a temperature compensated oscillator is provided that has a voltage controlled oscillation circuit whose output signal oscillation frequency changes according to supplied voltage, a temperature compensation circuit that outputs temperature compensation voltage for keeping the output signal oscillation frequency constant based on temperature, a voltage control circuit that outputs frequency control voltage for making the output signal oscillation frequency the frequency to be set based on the externally supplied frequency control signal, and an adder that outputs the temperature compensation voltage and the frequency control voltage added together. The temperature compensated oscillator may include a first filter circuit that removes noise contained in the temperature compensation voltage, a switching circuit connected in parallel with the first filter circuit, a second filter circuit that removes noise contained in the frequency control voltage, and a power control circuit that controls power supply at least to the voltage controlled oscillation circuit and the temperature compensation circuit, respectively. The power control circuit turns on the switching circuit for a specified period when power supply to the voltage controlled oscillation circuit is started.

In accordance with another exemplary embodiment of this invention, a temperature compensated oscillator is provided that has a voltage controlled oscillation circuit whose output signal oscillation frequency changes according to supply voltage, a temperature compensation circuit that outputs temperature compensation voltage for keeping the output signal oscillation frequency constant based on temperature, a voltage control circuit that outputs frequency control voltage for making the output signal oscillation frequency the frequency to be set based on the externally supplied frequency control signal, and an adder that outputs the temperature compensation voltage and the frequency control voltage added together. The temperature compensated oscillator may include a first filter circuit that is a circuit for removing noise contained in the temperature compensation voltage and is a low-pass filter where capacitance elements are connected in parallel to resistor elements, a second filter circuit that removes noise contained in the frequency control voltage, and a power control circuit that controls power supply at least to the voltage controlled oscillation circuit and the temperature compensation circuit, respectively. A switching circuit is provided for switching the connection locations of one end of all of the capacitance elements between the temperature compensation voltage output side and the temperature compensation voltage input side of the resistor elements. The power control circuit connects, by the switching circuit, one end of the capacitance elements to the temperature compensation voltage input side of the register elements when power supply to the voltage controlled oscillation circuit is started, and to the temperature compensation voltage output side of the resistor elements after a specified period has passed.

In accordance with another exemplary embodiment of this invention, a temperature compensated oscillator is provided that has a voltage controlled oscillation circuit whose output signal oscillation frequency changes according to supplied voltage, a temperature compensation circuit that outputs temperature compensation voltage for keeping the output signal oscillation frequency constant based on temperature, a voltage control circuit that outputs frequency control voltage for making the output signal oscillation frequency the frequency to be set based on the externally supplied frequency control signal, and an adder that outputs the temperature compensation voltage and the frequency control voltage added together. The temperature compensated oscillator may include a first filter circuit that is a circuit for removing noise contained in the temperature compensation voltage and is a low-pass filter of plural number of stages where capacitance elements are connected in parallel to resistor elements, a second filter circuit that removes noise contained in the frequency control voltage, and a power control circuit that controls power supply at least to the voltage controlled oscillation circuit and the temperature compensation circuit, respectively. The switching circuit is a circuit for switching the connection locations of one end of all of the capacitance elements between the temperature compensation voltage output side of each corresponding resistor element and the temperature compensation voltage input side of the resistor element closest to the temperature compensation circuit among all of the resistor elements. The power control circuit connects, by the switching circuit, one end of the capacitance elements to the temperature compensation voltage input side of the resistor element closest to the temperature compensation circuit when power supply to the voltage controlled oscillation circuit is started, and to the temperature compensation voltage output side of each corresponding resistor elements after a specified period has passed.

In accordance with another exemplary embodiment of this invention, in the temperature compensated oscillator described above, an inductance element is used in place of the resistance element in the first filter circuit.

In accordance with another exemplary embodiment of this invention, the temperature compensated oscillator described above has, between the temperature compensation circuit and the filter circuit, an output switching circuit that can switch between a first mode where the output voltage follows the temperature compensation voltage, and a second mode where the output voltage is maintained at the temperature compensation voltage of the mode switching time. The power control circuit switches the output switching circuit to the first mode when power supply to the temperature compensation circuit is started, and to the second mode when power supply to the temperature compensation circuit is stopped.

In accordance with another exemplary embodiment of this invention, a temperature compensated oscillator is provided that has a voltage controlled oscillation circuit whose output signal oscillation frequency changes according to supplied voltage, a temperature compensation circuit that outputs temperature compensation voltage for keeping the output signal oscillation frequency constant based on temperature, a voltage control circuit that outputs frequency control voltage for making the output signal oscillation frequency the frequency to be set based on the externally supplied frequency control signal, and an adder that outputs the temperature compensation voltage and the frequency control voltage added together. The temperature compensated oscillator may include an output switching circuit that can switch between a first mode where the output voltage follows the temperature compensation voltage, and a second mode where the output voltage is maintained at the temperature compensation voltage of the mode switching time, a first filter circuit that removes noise contained in the temperature compensation voltage output via the output switching circuit, a second filter circuit that removes noise contained in the frequency control voltage, and a power control circuit that controls power supply at least to the voltage controlled oscillation circuit and the temperature compensation circuit, respectively. The power control circuit switches the output switching circuit to the first mode when power supply to the temperature compensation circuit is started, and to the second mode when power supply to the temperature compensation circuit is stopped.

In accordance with another exemplary embodiment of this invention, in the temperature compensated oscillator described above, the power control circuit stops power supply to circuits, except the output switching circuit, when power supply to the voltage controlled oscillation circuit and the temperature compensation circuit are stopped.

In accordance with another exemplary embodiment of this invention, in the temperature compensated oscillator described in above, the cut-off frequency of the second filter circuit is higher than the cut-off frequency of the first filter circuit.

In accordance with another exemplary embodiment of this invention, in the temperature compensated oscillator described above, the second filter circuit consists of resistor elements and capacitance elements, respectively.

In accordance with another exemplary embodiment of this invention, in the temperature compensated oscillator described above, the second filter circuit consists of inductance elements and capacitance elements, respectively.

In accordance with another exemplary embodiment of this invention, in the temperature compensated oscillator described above, the power control circuit controls power supply to the voltage controlled oscillation circuit and the temperature compensation circuit based on the externally supplied control signal.

In accordance with another exemplary embodiment of this invention, in the temperature compensated oscillator described above, the power control circuit starts power supply to the voltage controlled oscillation circuit and the temperature compensation circuit at the same time, and the power supply is stopped at the same time.

In accordance with another exemplary embodiment of this invention, in the temperature compensated oscillator described above, the voltage controlled oscillation circuit has an oscillation circuit for oscillating an piezoelectric resonator, and a variable capacitance element whose capacitance changes according to the voltage supplied.

In accordance with another exemplary embodiment of this invention, in the temperature compensated oscillator described above, component parts except the piezoelectric resonator are constructed as one-chip IC.

In accordance with another exemplary embodiment of this invention, in the temperature compensated oscillator described above, the one-chip IC and the piezoelectric resonator are stored in one package.

In accordance with another exemplary embodiment of this invention, the temperature compensated oscillator described above operates based on the output signal of the temperature compensated oscillation circuit.

In accordance with another exemplary embodiment of this invention, a method is provided for controlling a temperature compensated oscillator that has a voltage controlled oscillation circuit whose output signal oscillation frequency changes according to the supplied voltage and a temperature compensation circuit that outputs temperature compensation voltage for keeping the output signal oscillation frequency constant based on temperature. The method may include removing noise contained in the temperature compensation voltage using a filter circuit, and controlling power supply at least to the voltage controlled oscillation circuit and the temperature compensation circuit, respectively, using a power control circuit. The power control circuit turns on a switching circuit connected in parallel with the filter circuit only for a specified period when power supply to the voltage controlled oscillation circuit is started.

In accordance with another exemplary embodiment of this invention, the method for controlling a temperature compensated oscillator described above includes switching between a first mode where the output voltage follows the temperature compensation voltage, and a second mode where the output voltage is maintained at the temperature compensation voltage of the mode switching time, using an output switching circuit between the temperature compensation circuit and the filter circuit. The power control circuit switches the output switching circuit to the first mode when power supply to the temperature compensation circuit is started, and switches the output switching circuit to the second mode when power supply to the temperature compensation circuit is stopped.

In accordance with another exemplary embodiment of this invention, a method is provided for controlling a temperature compensated oscillator that has a voltage controlled oscillation circuit whose output signal oscillation frequency changes according to the supplied voltage and a temperature compensation circuit that outputs temperature compensation voltage for keeping the output signal oscillation frequency constant based on temperature. The method may include switching between a first mode where the output voltage follows the temperature compensation voltage, and a second mode where the output voltage is maintained at the temperature compensation voltage of the mode switching time, using an output switching circuit, removing noise contained in the temperature compensation voltage output via the output switching circuit using a filter circuit, and controlling power supply at least to the voltage controlled oscillation circuit and the temperature compensation circuit, respectively, using a power control circuit. The power control circuit switches the output switching circuit to the first mode when power supply to the temperature compensation circuit is started, and to the second mode when power supply to the temperature compensation circuit is stopped.

In accordance with another exemplary embodiment of this invention, in the method for controlling a temperature compensated oscillator described above, the power control circuit stops power supply to circuits, except the output switching circuit, when power supply to the voltage controlled oscillation circuit and the temperature compensation circuit are stopped.

In accordance with another exemplary embodiment of this invention, a method is provided for controlling a temperature compensated oscillator that has a voltage controlled oscillation circuit whose output signal oscillation frequency changes according to supplied voltage, a temperature compensation circuit that outputs temperature compensation voltage for keeping the output signal oscillation frequency constant based on temperature, a voltage control circuit that outputs frequency control voltage for making the output signal oscillation frequency the frequency to be set based on the externally supplied frequency control signal, and an adder that outputs the temperature compensation voltage and the frequency control voltage added together. The method may include removing noise contained in the temperature compensation voltage using a first filter circuit, removing noise contained in the frequency control voltage using a second filter circuit, and controlling power supply to the voltage controlled oscillation circuit and the temperature compensation circuit, respectively, using a power control circuit. The power control circuit turns on a switching circuit connected in parallel with the first filter circuit for a specified period when power supply to the voltage controlled oscillation circuit is started.

In accordance with another exemplary embodiment of this invention, the method for controlling a temperature compensated oscillator described above includes switching between a first mode where the output voltage follows the temperature compensation voltage, and a second mode where the output voltage is maintained at the temperature compensation voltage of the mode switching time, using an output switching circuit between the temperature compensation circuit and the first filter circuit. The power control circuit switches the output switching circuit to the first mode when power supply to the temperature compensation circuit is started, and to the second mode when power supply to the temperature compensation circuit is stopped.

In accordance with another exemplary embodiment of this invention, a method is provided for controlling a temperature compensated oscillator that has a voltage controlled oscillation circuit whose output signal oscillation frequency changes according to supplied voltage, a temperature compensation circuit that outputs temperature compensation voltage for keeping the output signal oscillation frequency constant based on temperature, a voltage control circuit that outputs frequency control voltage for making the output signal oscillation frequency the frequency to be set based on externally supplied frequency control signal, and an adder that outputs the temperature compensation voltage and the frequency control voltage added together. The method may include switching between a first mode where the output voltage follows the temperature compensation voltage, and a second mode where the output voltage is maintained at the temperature compensation voltage of the mode switching time, using an output switching circuit, removing noise contained in the temperature compensation voltage output via the output switching circuit using a first filter circuit, removing noise contained in the frequency control voltage using a second filter circuit, and controlling power supply at least to the voltage controlled oscillation circuit and the temperature compensation circuit, respectively, using a power control circuit. The power control circuit switches the output switching circuit to the first mode when power supply to the temperature compensation circuit is started, and to the second mode when power supply to the temperature compensation circuit is stopped.

In accordance with another exemplary embodiment of this invention, in the method for controlling a temperature compensated oscillator described above, the power control circuit stops power supply to circuits, except the output switching circuit, when power supply to the voltage controlled oscillation circuit and the temperature compensation circuit are stopped.

In accordance with another exemplary embodiment of this invention, in the method for controlling a temperature compensated oscillator described above, the power control circuit controls power supply to the voltage controlled oscillation circuit and the temperature compensation circuit based on externally supplied control signals.

BRIEF DESCRIPTION OF THE DRAWINGS

FIG. 1 is a block diagram of a temperature compensated oscillator related to a first exemplary embodiment of this invention.

FIG. 2 is a figure showing an example of construction of a switch in the temperature compensated oscillator.

FIG. 3 is a property curve serving as an explanation of the voltage conversion circuit in the temperature compensated oscillator.

FIG. 4 is a circuit diagram of an example of the voltage controlled oscillation circuit in the temperature compensated oscillator.

FIG. 5 is a circuit diagram of an example of the voltage controlled oscillation circuit in the temperature compensated oscillator.

FIG. 6 is a timing chart of the temperature compensated oscillator.

FIG. 7 is a block diagram of a temperature compensated oscillator related to a second exemplary embodiment of the invention.

FIG. 8 is a figure showing an example of construction of a switch in the temperature compensated oscillator.

FIG. 9 is a block diagram of a temperature compensated oscillator related to a third exemplary embodiment of the invention.

FIG. 10 is a block diagram of a case where the temperature compensated oscillator is applied to a portable wireless communication device.

FIG. 11 is a timing chart of the temperature compensated oscillator.

FIG. 12 is a block diagram of a temperature compensated oscillator related to a fourth exemplary embodiment of the invention.

FIG. 13 is an oblique view of a temperature compensated oscillator related to a first modification example.

FIG. 14 is an oblique view of a temperature compensated oscillator related to the first modification example.

FIG. 15 is a block diagram of a related analog temperature compensated oscillator.

FIG. 16 is a block diagram of the digital temperature compensated oscillator.

FIG. 17 is a frequency property curve of the filter circuit (LPF).

FIG. 18 is a property curve of SSB phase noise of the output signal of the temperature compensated oscillator.

FIG. 19 is a property curve of the oscillation starting time of the output signal of the temperature compensated oscillator.

FIG. 20 is a block diagram of a VC-TCXO where a filter circuit is inserted.

DETAILED DESCRIPTION OF PREFERRED EMBODIMENTS

Below, exemplary embodiments of this invention are explained by referring to the drawings when appropriate.
(1) First Exemplary Embodiment
(1-1) Construction of the First Embodiment Shown in FIG. 1 is a block diagram of a temperature compensated oscillator related to a first exemplary embodiment of this invention.

A temperature compensated oscillator 15 is constructed by being equipped with a temperature compensation circuit 21, a filter circuit 23, a switch SW1 connected in parallel to the filter circuit 23, a voltage control circuit 25, a power control circuit 26, an adder 27, and a voltage controlled oscillation circuit 28.

Here, the temperature compensation circuit 21 can have a construction that can output temperature compensation voltage Vc1 so that any change in frequency temperature property of a piezoelectric resonator X is canceled. For example, the temperature compensation circuit 21, described in the prior art technology, can be constructed with a temperature sensor, an analog/digital converter circuit, a memory, and a digital/analog converter circuit. After converting temperature information into a digital signal, it is converted to the data for temperature compensation prerecorded in the memory, and it can be applied to a digital type that outputs temperature compensation voltage Vc1 by converting the data for temperature compensation from digital to analog, or to an analog type that outputs temperature compensation voltage, Vc1 by utilizing temperature properties of chips such as a thermistor.

The filter circuit (the first filter circuit) 23 is a low-pass filter consisting of resistor elements and capacitors (capacitance elements), or inductance elements and capacitors, and removes the high-frequency component of the temperature compensation voltage Vc1, namely noise contained in the temperature compensation voltage Vc1.

Also because the switch SW1 is connected in parallel in this filter circuit 23, when the switch SW1 is in an ON state, the temperature compensation voltage Vc1 does not go through the filter circuit 23. It is output via the switch SW1. FIG. 2 is a circuit diagram of the switch SW1 surroundings when this switch SW1 is composed of an analog switch.

The voltage control circuit 25 is a circuit, that a voltage conversion circuit of the conventional VC-TCXO-type (13 shown in FIG. 20), etc., can be applied to, and that generates the frequency control voltage Vc2 based on the frequency control signal φVC supplied via the frequency control voltage input terminal VC.

For example, as the voltage control circuit 25, shown with codes A, B, and C in FIG. 3, applied is a circuit where inclination of the frequency control voltage Vc2 relative to the frequency control signal φVC is changed or polarity of change in the frequency control voltage Vc2 is changed.

The adder 27 adds the temperature compensation voltage Vc1, supplied via the filter circuit 23, and the frequency control voltage Vc2, and outputs it to the voltage controlled oscillation circuit 28.

The voltage controlled oscillation circuit 28 is composed of an oscillation circuit 29 consisting of a buffer circuit and an oscillation circuit that oscillates piezoelectric resonator X, such as a quartz crystal resonator, a ceramic resonator, etc., and a variable capacitance element Cv. The voltage controlled oscillation circuit 28 applied is constructed using bipolar transistors Q1 and Q2 shown in FIG. 4, or a CMOS-type where an inverter IV1 or IV2 is composed of MOS-type transistors shown in FIG. 5.

The voltage controlled oscillation circuit 28 is controlled so that the oscillation frequency of the output signal P remains constant due to the temperature compensation voltage Vc1 even if temperature changes. It is also controlled so that oscillation frequency of the output signal P is to be set by the frequency control voltage Vc2.

In FIG. 1 the voltage control circuit (power control circuit) 26 is a circuit that controls power supply to the temperature compensation circuit 21, the voltage control circuit 25, and the oscillation circuit 29, and controls power supply to the individual circuits based on the standby control signal φST supplied externally via the standby control terminal STBY. This power control circuit 26 is provided with power from external power source via the power terminals VCC and GND.

Here, the voltage control circuit 26 outputs an output signal of desired oscillation frequency by having the temperature compensation voltage Vc1 and the frequency control voltage Vc2 supplied to the voltage controlled oscillation circuit 28 when the externally supplied standby control signal φST is at an H level.

Also, the power control circuit 26 stops action of each circuit when externally supplied standby control signal φST is at the L level. Namely, by stopping power supply to the temperature compensation circuit 21, the voltage control circuit 25 and the oscillation circuit 29, power consumption of the temperature compensated oscillator 15 can be reduced.

Furthermore, the power control circuit 26 changes the switch SW1 to an ON state by setting the switch control signal φS1 to an H level for a short time, synchronizing it with increase of externally supplied standby control signal φST.

Therefore, when the standby control signal φST becomes the H level, the temperature compensation voltage Vc1 is output via the switch SW1 without going through the filter circuit 23.

Because of this, when the standby control signal φST becomes the H level, the temperature compensation voltage Vc1 is supplied to the voltage controlled oscillation circuit 28 in a short time by avoiding the delay time caused by going through the filter circuit 23 that has a relatively large time constant.

(1-2) Actions of the First Embodiment

FIG. 6 is a timing chart of the temperature compensated oscillator 15, and actions of the temperature compensated oscillator 15 are explained by referring to this figure. Here, the temperature compensated oscillator 15 is provided with power voltage to the power terminal VCC from time T1 as shown in portion (A), where the standby control signal φST is supplied to the standby control terminal STBY as shown in portion (B).

First of all, if the standby control signal φST increases to the H level at time T1, the power control circuit 26 starts to supply power voltage VREG to each circuit, and the temperature compensation circuit 21, the voltage control circuit 25, the oscillation circuit 29, and the adder 27 start operating.

Also, when the standby control signal φST becomes the H level, as shown in portion (D), because the switching control signal φS1 increases to the H level for a short period in synchronization with the increase of the standby control signal φST, the temperature compensation circuit 21 is short-circuited via the switch SW1.

Because of this, in the temperature compensated oscillator 15, the rise time of the temperature compensation voltage Vc1 can be reduced compared with the case where the temperature compensation voltage Vc1 is supplied via the filter circuit 23 to the voltage controlled oscillation circuit 28, and the frequency control of the output signal P, by the temperature compensation voltage Vc1, can be started in a short time.

Also, once the power voltage VREG is supplied to the voltage control circuit 25 at time T1, as shown in portion (C), the voltage control circuit 25 outputs the frequency control voltage Vc2 based on the frequency control signal φVC, and by the frequency control voltage Vc2 being supplied via the adder 27 to the voltage controlled oscillation circuit 28, frequency control of the output signal by the frequency control voltage Vc2 is started.

Next, as shown in portion (D), once the switch control signal φS1 reaches to the L level at time T2, because the switch SW1 goes to the OFF position, the temperature compensation voltage Vc1 is supplied via the filter circuit 23 to the voltage controlled oscillation circuit 28.

Therefore, when the switch SW1 goes to the OFF position, noise contained in the temperature compensation voltage Vc1 is removed.

The temperature compensated oscillator 15 can reduce phase noise of the output signal P by removing noise contained in the temperature compensation voltage Vc1 using the filter circuit 23.

Next, once the standby control signal φST reaches the L level at time T3 as shown in portion (B), supply of power voltage VREG to each circuit by the power control circuit 26 is stopped as shown in portion (C), and actions of the temperature compensation circuit 21, the voltage control circuit 25, the oscillation circuit 29, and the adder 27 are stopped.

In this way, the temperature compensated oscillator 15 can reduce power consumption by starting or stopping output of the output signal P based on the standby control signal φST.

Here, if oscillation frequency of the output signal P, that this temperature compensated oscillator 15 should output is denoted as f0, the difference between the actual output oscillation frequency and the supposed oscillation frequency f0 to be output is denoted as df. The temperature compensated oscillator 15 can stabilize the frequency of the output signal P to the desired frequency f0 to be set within a short time once the standby control signal φST increases.

Also, the temperature compensated oscillator 15, related to this embodiment, connects the switch SW1 in parallel to the filter circuit 23, and can stabilize oscillation frequency of the output signal P to the desired frequency within a short time by setting the switch SW1 to the ON position for a short time once the standby control signal φST increases.

By these, the temperature compensated oscillator 15, related to this embodiment, can reduce phase noise of the output signal and also stabilize the output signal frequency within a short time.

By the way, when the inventors manufactured this temperature compensated oscillator 15, a value of about −120 [dBc/Hz] could be obtained at the offset frequency of 100 [Hz] as the phase noise property.

(2) Second Exemplary Embodiment
(2-1) Construction of the Second Embodiment

Shown in FIG. 7 is a block diagram of a temperature compensated oscillator related to a second exemplary embodiment of this invention.

Because the temperature compensated oscillator 17 has the same construction as the temperature compensated oscillator 15 related to the first embodiment, except for the point that a switch SW1A is different, the same parts are indicated using the same codes, and duplicate explanations are omitted.

In this temperature compensated oscillator 17, the switch SW1A is a switch for switching the connection location of one end of a capacitor C in the filter circuit 23 between the terminal A connected to the temperature compensation circuit 21 side (temperature compensation voltage input side) of the resistor element R, and the adder 27 side (temperature compensation voltage output side) of the resistor element R.

Also, this switch SW1A is constructed so that it connects the capacitor C to the terminal A when the switch control signal φS1 is at the H level, and to the terminal B when the switch control signal φS1 is at the L level, where the application is a construction in which an inverter is inserted between two analog switches that become the ON position if an H-level signal is input, etc., as shown in FIG. 8.

(2-2) Actions of the Second Embodiment

Next, actions of this temperature compensated oscillator 17 are explained. Here, because the timing chart of this temperature compensated oscillator 17 is almost the same as the timing chart of the temperature compensated oscillator 15, explanation is given to the parts whose actions are different by using FIG. 6 as a reference.

In this temperature compensated oscillator 17, once the standby control signal φST reaches the H level at time T1 as shown in portion (B), the switch control signal φS1 reaches the H level for a short period in synchronization with the stand-up of the standby control signal φST as shown in portion (D), and the connection located on one end of the capacitor C in the filter circuit 23 switches from the terminal B to the terminal A only for a short period.

Therefore, oscillation starting time delay due to recharging of the capacitor C caused by the resistor R is reduced.

By this, in the temperature compensated oscillator 17, after the connection location of one end of the capacitor C is switched from the terminal A to the terminal B, delay of the temperature compensation voltage Vc1 due to a relatively large time constant of the filter circuit 23 can be reduced.

When the inventors manufactured the temperature compensated oscillator 17, a value of about −121 [dBc/Hz] could be obtained at the offset frequency of 100 [Hz] as the phase noise property.

(3) Third Exemplary Embodiment
(3-1) Construction of the Third Embodiment

Shown in FIG. 9 is a block diagram of a temperature compensated oscillator related to a third exemplary embodiment of this invention.

Because the temperature compensated oscillator 20 has the same construction as the temperature compensated oscillator 15 related to the first embodiment, except for the point that a filter circuit 24 is added, the same parts are indicated with the same codes, and duplicated explanations are omitted.

A track & hold circuit (output switching circuit) 22 switches between the track mode (first mode) and the hold mode (second mode) according to the mode control signal φTH supplied from the power control circuit 26, outputs the input voltage as it is by passing through as the output voltage under the track mode, and outputs by maintaining the input voltage at the time of mode switch. In the case of the circuit shown in FIG. 1, the track & hold circuit 22 switches to the track mode when the mode control signal φTH is at the H level, and to the hold mode when the mode control signal φTH is at the L level. This track & hold circuit 22 may be constructed using a well-known circuit. As the simplest basic construction, considered is a circuit constructed using a switch circuit that changes to the ON position when the mode control signal φTH is at the H level, and a capacitor that retains the output voltage when the switch circuit changes to the OFF position.

The filter circuit (first filter circuit) 23 is a low-pass filter consisting of resistor elements and capacitors (capacitor elements), or inductance elements and capacitors, and it removes the high-frequency component of the temperature compensation voltage Vc1 output via the track & hold circuit 22. Namely, when the track & hold circuit 22 is in the track mode, because the output voltage is the temperature compensation voltage Vc1 output from the temperature compensation circuit 21, it removes noise contained in the temperature compensation voltage Vc1.

Also, because the switch SW1 is connected in parallel to this filter circuit 23, when the switch SW1 is in the ON position, the temperature compensation voltage Vc1 output via the track & hold circuit 22 is output via the switch SW1 without going through the filter circuit 23.

As the voltage control circuit 25, the conventional VC-TCXO voltage conversion circuit (13, shown in FIG. 20) etc. can be applied, and it is a circuit that produces the frequency control voltage Vc2 based on the frequency control signal φVC supplied via the frequency control voltage input terminal VC.

The filter circuit (second filter circuit) 24 is a low-pass filter consisting of resistor elements and capacitance elements for example, and removes the high-frequency component of the frequency control voltage Vc2 supplied from the voltage control circuit 25. Therefore, the filter circuit 24 removes noise contained in the frequency control voltage Vc2 such as noise contained in the frequency control signal φVC supplied externally to the frequency control voltage input terminal VC, noise inside the voltage control circuit 25, etc.

Also, because the filter circuit 24 can remove noise contained in the frequency control voltage Vc2, if the cut-off frequency is set to the level of several 100 Hz to several kHz, those with relatively small time constants are applied to.

On the other hand, the filter circuit 23 needs to set the cut-off frequency to the level of several 10 Hz to several 100 Hz for removing noise contained in the temperature compensation voltage Vc1. Because of this, to this filter circuit 23 those with lower cut-off frequency fc than those of filter circuit 24 are applied.

In FIG. 9, the voltage control circuit (power control circuit) 26 controls power supply to individual circuits based on the standby control signal φST supplied externally via the standby terminal STBY, and also switches the track & hold circuit 22 to the track mode or the hold mode by outputting the mode control signal φTH based on the standby control signal φST as stated above.

Namely, the power control circuit 26 supplies the power voltage VREG to each circuit when the standby control signal φST is at the H level, and also sets the mode control signal φTH to the H level to switch the track & hold circuit 22 to the track mode.

On the other hand, the power control circuit 26 stops supply of the power voltage VREG when the standby control signal φST is at the L level, and also sets the mode control signal φTH to the L level to switch the track & hold circuit 22 to the hold mode.

Therefore, the power control circuit 26 has the output signal of desired oscillation frequency output by having the temperature compensation voltage Vc1 and the frequency control voltage Vc2 supplied to the voltage controlled oscillation circuit 28 when the externally supplied standby control signal φST is at the H level.

Also, the power control circuit 26 stops actions of individual circuits when the externally supplied standby control signal φST is at the L level. Namely, by stopping power supply to circuits, except the power control circuit 26 and the track & hold circuit 22, power consumption of the temperature compensated oscillator 20 can be reduced.

At this time, because the track & hold circuit 22 goes into the hold mode, it maintains the output voltage at the temperature compensation voltage Vc1 at the time of switching modes. Because of this, once the externally supplied standby control signal φST goes into the H level and it is switched to the track mode, the track & hold circuit 22 can immediately output the temperature compensation voltage Vc1 from the temperature compensation circuit 21 without a delay.

Furthermore, the power control circuit 26 sets the switch SW1 to the ON position for a short period by setting the switch control signal φS1 to the H level for a short period in synchronization with the rise of the externally supplied standby control signal φST.

Therefore, once the standby control signal φST goes into the H level, the temperature compensation voltage Vc1 output via the track & hold circuit 22 is output via the switch SW1 without going through the filter circuit 23.

Because of this, the standby control signal φST goes into the H level, and the temperature compensation voltage Vc1 is supplied to the voltage controlled oscillation circuit 28 within a short time by avoiding a delay time caused by going through the filter circuit 23 that has a relatively large time constant.

FIG. 10 is a block diagram of when this temperature compensated oscillator 20 is applied to a portable wireless communication device. This portable wireless communication device 30 is the same as the conventional portable wireless communication device except that the temperature compensation oscillators are different and the central processing computing circuit (CPU) 31 outputs the standby control signal φST to the standby control terminal STBY of the temperature compensated oscillator 20.

Also, the shaded part in FIG. 10 is the part where an intermittent operation is performed for reducing the standby power consumption when waiting in this portable wireless communication device 30.

Although this part for performing an intermittent operation is the same as in the conventional portable wireless communication device, this portable wireless communication device 30 can directly control whether the temperature compensated oscillator 20 should be driven according to the standby control signal φST.

The display/keyboard section 32 is always driven so that it can always accept input by the user, and the synthesizer for transmitter 33 and the sending filter/amplifier section 34 are driven only when sending.

(3-2) Actions of the Third Embodiment

FIG. 11 is a timing chart of this temperature compensated oscillator 20, and explanation is given on the actions of the temperature compensated oscillator 20 by referring to this figure. Here, the temperature compensated oscillator 20 is provided with power voltage to the power terminal VCC from time T1 as shown in portion (A), and assumed is a case where the standby control signal φST is supplied to the standby control terminal STBY as shown in portion (B).

First of all, once the standby control signal φST reaches the H level at time T1, the power control circuit 26 starts supplying power voltage VREG to each circuit as shown in portion (C), and the temperature compensation circuit 21, the voltage control circuit 25, the oscillation circuit 29, and the adder 27 start operating.

Also, once the standby control signal φST reaches the H level, because the mode control signal φTH reaches the H level as shown in portion (D), the track & hold circuit 22 switches to the track mode. By this, the temperature compensation voltage Vc1 supplied from the temperature compensation circuit 21 can be output at once without being delayed by the track & hold circuit 22.

Furthermore, because the switching control signal φS1 reaches the H level for a short period in synchronization with the rise of the standby control signal φST, as shown in portion (E), the track & hold circuit 22 is short-circuited via the switch SW1.

Because of this, in the temperature compensated oscillator 20, initial voltage that can be supplied to the voltage controlled oscillation circuit 28 can be set high relative to the case where it goes through the filter circuit 23, and frequency control of the output signal P by the temperature compensation voltage Vc1 can be started within a short time.

Then, once the power voltage VREG is supplied to the voltage control circuit 25 at time T1, the voltage control circuit 25 outputs the frequency control voltage Vc2 based on the frequency control signal φVC.

This frequency control voltage Vc2 has its noise removed by the filter circuit 24, and is supplied to the voltage controlled oscillation circuit 28 via the adder 27.

Here, as stated above, because the cut-off frequency fc of this filter circuit 24 is set to a high value, the time constant is set to a relatively small value, the frequency control voltage Vc2 is supplied to the voltage controlled oscillation circuit 28 with almost no delay by the filter circuit 24.

Therefore, the temperature compensated oscillator 20 can start frequency control of the output signal by the frequency control voltage Vc2 within a short time without sacrificing frequency control response to the change of the frequency control voltage Vc2 even if noise of the frequency control voltage Vc2 is removed using the filter circuit 24.

Next, as shown in portion (E), once the switching control signal φS1 becomes the L level at time T2, because the switch SW1 goes to the OFF position, the temperature compensation voltage Vc1 is supplied via the filter circuit 23 to the voltage controlled oscillation circuit 28.

Therefore, when the switch SW1 goes to the OFF position, noise contained in the temperature compensation voltage Vc1 is removed.

By this, the temperature compensated oscillator 20 can reduce phase noise of the output signal P by removing noise contained in the temperature compensation voltage Vc1 and the frequency control voltage Vc2 by the filter circuits 23 and 24, respectively.

Once the standby control signal φST reaches the L level at time T3 as shown in portion (B), supply of power voltage VREG by the power control circuit 26 to each circuit is stopped, and the temperature compensation circuit 21, the voltage control circuit 25, the oscillation circuit 29, and the adder 27 stop operating.

In this way, the temperature compensated oscillator 20 can reduce power consumption by starting or stopping output of the output signal P based on the standby control signal φST.

Also, as shown in portion (D), because the mode control signal φTH reaches the L level at time T3, the track & hold circuit 22 switches to the hold mode, and the output voltage of the track & hold circuit 22 is maintained at the temperature compensation voltage Vc1 of the mode switching time.

By this, when the standby control signal φST reaches the H level again at T4, as shown in portion (B), the temperature compensation voltage Vc1 supplied from the temperature compensation circuit 21 can be output at once without a delay by the track & hold circuit 22.

Here, if oscillation frequency of the output signal P that this temperature compensated oscillator 20 should output is denoted as f0, and the difference between the actual output oscillation frequency and the supposed oscillation frequency f0 to be output is denoted as df, as this frequency deviation is df/f0 a shown in portion (G). The temperature compensated oscillator 20 can stabilize frequency of the output signal P to the desired frequency f0 to be set within a short time once the standby control signal φST has increased.

Also, the temperature compensated oscillator 20 related to this embodiment connects the switch SW1 in parallel to the filter circuit 23, and can stabilize oscillation frequency of the output signal P to the desired frequency within a short time by setting the switch SW1 to the ON position for a short time once the standby control signal φST has increased.

By these, the temperature compensated oscillator 20 related to this embodiment can reduce phase noise of the output signal further in addition to the efficacy of the embodiment by installing the filter circuit 24, and also stabilizing the output signal frequency within a short time by installing the track & hold circuit 22.

(4) Fourth Exemplary Embodiment

Shown in FIG. 12 is a block diagram of a temperature compensated oscillator related to a fourth exemplary embodiment of this invention.

Because this temperature compensated oscillator 20A has the same construction as the temperature compensated oscillator 20 in the third embodiment, except for the point that the switch SW1A is different, the same parts are indicated with the same codes attached, and duplicated explanations are omitted.

Also, because the timing chart of this temperature compensated oscillator 20A is almost the same as the timing chart of the temperature compensated oscillator 20, parts where their actions are different are explained using FIG. 11 as a reference.

In this temperature compensated oscillator 20A, the switch SW1A is a switch for switching the connection location of one end of the capacitor C in the filter circuit 23 between the terminal A connected to the track & hold circuit 22 side (temperature compensation voltage input side) of the resistor element R and the adder 27 side (temperature compensation output side) of the resistor element R.

Therefore, in this temperature compensated oscillator 20A, as shown in portion (E), when the switch control signal φS1 reaches the H level for a short period in synchronization with the rise of the standby control signal φST, the connection location of one end of the capacitor C in the filter circuit 23 switches from the terminal B to the terminal A only for a short period, and oscillation starting time delay due to recharging time of the capacitor C caused by the resistor R is reduced.

By this, the temperature compensated oscillator 20A obtains similar effects to that of the other embodiments.

(5) Modified Examples (5-1) First Modified Example

Although no mention was made on the mounting condition of the component parts consisting of the temperature compensated oscillator in the above exemplary embodiments, because the temperature compensated oscillator can remove noise contained in the temperature compensation voltage Vc1 or the frequency control voltage Vc2, elements and the like, composing the temperature compensated oscillator can be integrated.

Therefore, component parts, excluding the piezoelectric resonator X of the temperature compensated oscillator and the capacitor C, which may consist of the filter circuit 23 (a section surrounded with an alternate long and short dash line in FIG. 1, FIG. 7, FIG. 9, and FIG. 12) and component parts, excluding only the piezoelectric resonator X (a section surrounded with an alternate long and short dash line including a variable capacity element in FIG. 4 and FIG. 5), can be constructed as a one-chip IC, for example. A temperature compensated oscillator with a ceramic package sealed with a piezoelectric resonator X between itself and the lid can be constructed as shown in FIG. 13. A temperature compensated oscillator with a plastic package having a one-chip IC, the piezoelectric resonator X, and the variable capacity element Cv sealed by molding can be constructed as shown in FIG. 14.

Although a one-chip IC is connected to the board by wire bonding in FIG. 13 and FIG. 14, it is needless to say that other methods, such as flip chip bonding (FCB) can be applied. In the same way, component elements such as reactance elements of the filter circuit 23 or the filter circuit 24 can be mounted to the capacitor C. Even if the capacitor C is mounted on the exterior of the package in FIG. 13 and FIG. 14, efficacy of this invention does not change.

By this, the temperature compensated oscillator can be miniaturized, and the number of assembling process steps and manufacturing cost can be reduced by reducing the number of parts.

(5-2) Second Modification Example

Although this embodiment included a case where the filter circuit 23 or 24 was constructed with a single-stage low-pass filter, the invention is not limited to this, and it may be constructed with a multiple-stage low-pass filter.

In this case, in the temperature compensated oscillators 17 and 20A related to the second embodiment or the fourth embodiment, the connection locations of one end of all of the capacitors contained in the multiple-stage low-pass filter may be switched by the switch (SW1A) to the temperature compensation circuit side relative to all of the resistors or inductance elements contained in the multiple-stage low-pass filter at the start of oscillation.

(5-3) Third Modification Example

Although this embodiment included a case where the invention was applied to a temperature compensated oscillator that changes the output signal oscillation frequency based on the frequency control signal 4VC, the invention is not limited to this, and it may be applied to a temperature compensated oscillator that is not equipped with a frequency control voltage input terminal VC and that maintains the output signal oscillation frequency constant even if temperature changes In this case, the voltage control circuit 25, the filter circuit 24, and the adder 27 may be removed from the temperature compensated oscillator related to each embodiment. Also, in this case, in the same way as the embodiment, phase noise of the output signal can be reduced, and the output signal frequency can be stabilized within a short time.

(5-4) Fourth Modification Example

Described in the embodiment was a case where this temperature compensated oscillator was applied to a portable wireless communication device, this invention is not limited to this but can be widely applied to temperature compensated oscillators used in other electronic equipment.

[Efficacy of the Invention]

As stated above, in the temperature compensated oscillator of the invention, the switching circuit is connected in parallel to the filter circuit with a large time constant so that the temperature compensation voltage can be supplied to the voltage controlled oscillation circuit without going through the filter circuit when oscillation starts, phase noise of the output signal can be reduced by recharging the capacitor in the filter circuit, and also the output signal frequency can be stabilized within a short time without deteriorating the control response.

What is claimed is:

1. A temperature compensated oscillator that has a voltage controlled oscillation circuit where an output signal oscillation frequency changes according to supplied voltage and a temperature compensation circuit that outputs temperature compensation voltage for keeping said output signal oscillation frequency constant based on temperature, the temperature compensated oscillator comprising:

a filter circuit that removes noise contained in the temperature compensation voltage;

a switching circuit connected in parallel with said filter circuit, and a power control circuit that controls power supply at least to said voltage controlled oscillation circuit and said temperature compensation circuit, respectively, said power control circuit turning on said switching circuit for a specified period when power supply to said voltage controlled oscillation circuit is started.

2. A temperature compensated oscillator that has a voltage controlled oscillation circuit whose output signal oscillation frequency changes according to supplied voltage and a temperature compensation circuit that outputs temperature compensation voltage for keeping said output signal oscillation frequency constant based on temperature, the temperature compensated oscillator comprising:

a filter circuit that removes noise contained in said temperature compensation voltage that is a low-pass filter having capacitance elements connected in parallel to resistor elements via a switching circuit, and a power control circuit that controls power supply at least to said voltage controlled oscillation circuit and said temperature compensation circuit, respectively, said switching circuit switching connection locations of one end of all of said capacitance elements between a temperature compensation voltage output side and a temperature compensation voltage input side of said resistor elements, and said power control circuit controlling said switching circuit to connect one end of said capacitance elements to the temperature compensation voltage input side of said resistor elements when power supply to said voltage controlled oscillation circuit is started, and to the temperature compensation voltage output side of said resistor elements after a specified time period has passed.

3. A temperature compensated oscillator that has a voltage controlled oscillation circuit whose output signal oscillation frequency changes according to supplied voltage and a temperature compensation circuit that outputs temperature compensation voltage for keeping said output signal oscillation frequency constant based on temperature, the temperature compensated oscillator comprising:

a filter circuit that removes noise contained in said temperature compensation voltage that has a plurality of stages of low-pass filters having capacitance elements connected in parallel to resistor elements via a switching circuit, and a power control circuit that controls power supply at least to said voltage controlled oscillation circuit and said temperature compensation circuit, respectively, said switching circuit switching connection locations of one end of all of said capacitance elements between a temperature compensation voltage output side of each corresponding resistor element and a temperature compensation voltage input side of a resistor element closest to said temperature compensation circuit among all of said resistor elements, and said power control circuit controlling said switching circuit to connect one end of all of said capacitance elements to the temperature compensation voltage input side of the resistor element closest to said temperature compensation circuit when power supply to said voltage controlled oscillation circuit is started and to said temperature compensation voltage output side of each corresponding resistor element after a specified time period has passed.

4. The temperature compensated oscillator described in claim 3, inductance elements are used in place of said resistor elements in said filter circuit.

5. The temperature compensated oscillator described in claim 3, further comprising:

an output switching circuit, between said temperature compensation circuit and said filter circuit, that switches between a first mode where the output voltage follows the temperature compensation voltage, and a second mode where the output voltage is maintained at the temperature compensation voltage of the mode switching time, said power control circuit switching said output switching circuit to said first mode when power supply to said temperature compensation circuit is started, and to the second mode when power supply to said temperature compensation circuit is stopped.

6. A temperature compensated oscillator that has a voltage controlled oscillation circuit whose output signal oscillation frequency changes according to supplied voltage and a temperature compensation circuit that outputs temperature compensation voltage for keeping said output signal oscillation frequency constant based on temperature, the temperature compensated oscillator comprising:

an output switching circuit that switches between a first mode where the output voltage follows said temperature compensation voltage, and a second mode where the output voltage is maintained at said temperature compensation voltage of the mode switching time;

a filter circuit that removes noise contained in said temperature compensation voltage output via said output switching circuit; and a power control circuit that controls power supply at least to said voltage controlled oscillation circuit and said temperature compensation circuit, respectively, said power supply circuit switching said output switching circuit to said first mode when power supply to said temperature compensation circuit is started, and to said second mode when power supply to said temperature compensation circuit is stopped.

7. The temperature compensated oscillator described in claim 6, said power control circuit stopping power supply to circuits other than said output switching circuit, when power supply to said voltage controlled oscillator and said temperature compensation circuit are stopped.

8. A temperature compensated oscillator that has a voltage controlled oscillation circuit whose output signal oscillation frequency changes according to supply voltage, a temperature compensation circuit that outputs temperature compensation voltage for keeping the output signal oscillation frequency constant based on temperature, a voltage control circuit that outputs frequency control voltage for making the output signal oscillation frequency the frequency to be set based on an externally supplied frequency control signal, and an adder that outputs said temperature compensation voltage and said frequency control voltage added together, the temperature compensated oscillator comprising:

a first filter circuit that removes noise contained in said temperature compensation voltage;

a switching circuit connected in parallel with said first filter circuit;

a second filter circuit that removes noise contained in said frequency control voltage; and a power control circuit that controls power supply at least to said voltage controlled oscillation circuit and said temperature compensation circuit, respectively, said power control circuit turning on said switching circuit for a specified period of time when power supply to said voltage controlled oscillation circuit is started.

9. The temperature compensated oscillator described in claim 8, further comprising an output switching circuit between said temperature compensation circuit and said first filter circuit that can switch between a first mode where the output voltage follows the temperature compensation voltage, and a second mode where the output voltage is maintained at the temperature compensation voltage of the mode switching time, said power control circuit switching said output switching circuit to said first mode when power supply to said temperature compensation circuit is started, and to said second mode when power supply to said temperature compensation circuit is stopped.

10. A temperature compensated oscillator that has a voltage controlled oscillation circuit whose output signal oscillation frequency changes according to supplied voltage, a temperature compensation circuit that outputs temperature compensation voltage for keeping said output signal oscillation frequency constant based on temperature, a voltage control circuit that outputs frequency control voltage for making said output signal oscillation frequency the frequency to be set based on the externally supplied frequency control signal, and an adder that outputs said temperature compensation voltage and said frequency control voltage added together, the temperature compensated oscillator comprising:

a first filter circuit that removes noise contained in said temperature compensation voltage and that is a low-pass filter having capacitance elements connected in parallel to resistor elements;

a second filter circuit that removes noise contained in said frequency control voltage;

a power control circuit that controls power supplied at least to said voltage controlled oscillation circuit and said temperature compensation circuit, respectively; and a switching circuit that switches connection locations of one end of all of said capacitance elements between a temperature compensation voltage output side and a temperature compensation voltage input side, said power control circuit using said switching circuit to connect one end of said capacitance elements to the temperature compensation voltage input side of said resistor elements when power supply to said voltage controlled oscillation circuit is started, and to the temperature compensation voltage output side of said resistor elements after a specified time period has passed.

11. A temperature compensated oscillator that has a voltage controlled oscillation circuit whose output signal oscillation frequency changes according to supplied voltage, a temperature compensation circuit that outputs temperature compensation voltage for keeping said output signal oscillation frequency constant based on temperature, a voltage control circuit that outputs frequency control voltage for making said output signal oscillation frequency the frequency to be set based on the externally supplied frequency control signal, and an adder that outputs said temperature compensation voltage and said frequency control voltage added together, the temperature compensated oscillator comprising:

a first filter circuit that removes noise contained in said temperature compensation voltage and that is a low-pass filter having a plurality of stages having capacitance elements connected in parallel to resistor elements;

a second filter circuit that removes noise contained in said frequency control voltage;

a power control circuit that controls power supply at least to said voltage controlled oscillation circuit and said temperature compensation circuit, respectively; and a switching circuit that switches connection locations of one end of all said capacitance elements between a temperature compensation voltage output side of each corresponding resistor element and a temperature compensation voltage input side of a resistor element closest to said temperature compensation circuit among all of said resistor elements, said power control circuit controlling said switching circuit to connect one end of said capacitance elements to the temperature compensation voltage input side of said resistor element closest to said temperature compensation circuit when power supply to the voltage controlled oscillation circuit is started, and to the temperature compensation voltage output side of each corresponding resistor element after a specified time period has passed.

12. The temperature compensated oscillator described in claim 11, an inductance element being used in place of said resistance element in said first filter circuit.

13. A temperature compensated oscillator that has a voltage controlled oscillation circuit in which output signal oscillation frequency changes according to supplied voltage, a temperature compensation circuit that outputs temperature compensation voltage for keeping said output signal oscillation frequency constant based on temperature, a voltage control circuit that outputs frequency control voltage for making said output signal oscillation frequency the frequency to be set based on the externally supplied frequency control signal, and an adder that outputs said temperature compensation voltage and said frequency control voltage added together, the temperature compensated oscillator comprising:

an output switching circuit that switches between a first mode where the output voltage follows said temperature compensation voltage, and a second mode where the output voltage is maintained at said temperature compensation voltage of a mode switching time;

a first filter circuit that removes noise contained in said temperature compensation voltage output via said output switching circuit;

a second filter circuit that removes noise contained in said frequency control voltage; and a power control circuit that controls power supply at least to said voltage controlled oscillation circuit and said temperature compensation circuit, respectively, said power control circuit switching said output switching circuit to said first mode when power supply to the temperature compensation circuit is started, and to said second mode when power supply to said temperature compensation circuit is stopped.

14. The temperature compensated oscillator described in claim 13, said power control circuit stoping power supply to circuits other than said output switching circuit when power supply to said voltage controlled oscillation circuit and said temperature compensation circuit are stopped.

15. The temperature compensated oscillator described in claim 13, a cutoff frequency of said second filter circuit being higher than a cut-off frequency of said first filter circuit.

16. The temperature compensated oscillator described in claim 13, said second filter circuit comprising resistor elements and capacitance elements, respectively.

17. The temperature compensated oscillator described in claim 13, said second filter circuit comprising inductance chips and capacitance elements, respectively.

18. The temperature compensated oscillator described in claim 13, said power control circuit controlling power supply to said voltage controlled oscillation circuit and said temperature compensation circuit based on the externally supplied control signal.

19. The temperature compensated oscillator described in claim 13, said power control circuit starting power supply to said voltage controlled oscillation circuit and said temperature compensation circuit at the same time and said power supply being stopped at the same time.

20. The temperature compensated oscillator described in claim 13, said voltage controlled oscillation circuit comprising an oscillation circuit that oscillates an piezoelectric resonator and a variable capacitance element having capacitance changes according to voltage supplied.

21. The temperature compensated oscillator described in claim 13, component parts, except said piezoelectric resonator, being constructed as a one-chip IC.

22. The temperature compensated oscillator described in claim 21, said one-chip IC and said piezoelectric resonator being stored in one package.

23. A wireless communication device comprising said temperature compensated oscillator described in claim 22, and operating based on the output signal of said temperature compensated oscillation circuit.

24. A method of controlling a temperature compensated oscillator that has a voltage controlled oscillation circuit whose output signal oscillation frequency changes according to supplied voltage, and a temperature compensation circuit that outputs temperature compensation voltage for keeping said output signal oscillation frequency constant based on temperature, the method comprising:

removing noise contained in said temperature compensation voltage using a filter circuit; and controlling power supply to at least said voltage controlled oscillation circuit and said temperature compensation circuit, respectively, using a power control circuit, said power control circuit turning on a switching circuit connected in parallel with said filter circuit only for a specified time period when power supply to said voltage controlled oscillation circuit is started.

25. The method of controlling a temperature compensated oscillator described in claim 24, further comprising:

switching between a first mode where the output voltage follows said temperature compensation voltage and a second mode where the output voltage is maintained at said temperature compensation voltage of a mode switching time, using an output switching circuit between said temperature compensation circuit and said filter circuit, said power control circuit switching said output switching circuit to said first mode when power supply to said temperature compensation circuit is started, and switching said output switching circuit to said second mode when power supply to said temperature compensation circuit is stopped.

26. A method of controlling a temperature compensated oscillator that has a voltage controlled oscillation circuit whose output signal oscillation frequency changes according to supplied voltage, and a temperature compensation circuit that outputs temperature compensation voltage for keeping said output signal oscillation frequency constant based on temperature, the method comprising:

switching between a first mode where the output voltage follows said temperature compensation voltage, and a second mode where the output voltage is maintained at said temperature compensation voltage of the mode switching time, using an output switching circuit;

removing noise contained in said temperature compensation voltage output via said output switching circuit using a filter circuit; and controlling power supply to at least said voltage controlled oscillation circuit and said temperature compensation circuit, respectively, using a power control circuit, said power control circuit switching said output switching circuit to said first mode when power supply to said temperature compensation circuit is started, and switching said output switching circuit to said second mode when power supply to said temperature compensation circuit is stopped.

27. The method of controlling a temperature compensated oscillator described in claim 26, said power control circuit stopping power supply to circuits other than said output switching circuit, when power supply to said voltage controlled oscillation circuit and said temperature compensation circuit are stopped.

28. A method of controlling a temperature compensated oscillator that has a voltage controlled oscillation circuit whose output signal oscillation frequency changes according to supplied voltage, a temperature compensation circuit that outputs temperature compensation voltage for keeping said output signal oscillation frequency constant based on temperature, a voltage control circuit that outputs frequency control voltage for making said output signal oscillation frequency the frequency to be set based on the externally supplied frequency control signal, and an adder that outputs said temperature compensation voltage and said frequency control voltage added together, the method comprising:

removing noise contained in said temperature compensation voltage using a first filter circuit;

removing noise contained in said frequency control voltage using a second filter circuit; and controlling power supply at least to said voltage controlled oscillation circuit and said temperature compensation circuit, respectively, using a power control circuit, said power control circuit turning on a switching circuit connected in parallel with said first filter circuit for a specified time period when power supply to said voltage controlled oscillation circuit is started.

29. The method of controlling a temperature compensated oscillator described in claim 28, further comprising:

switching between a first mode where the output voltage follows said temperature compensation voltage, and a second mode where the output voltage is maintained at said temperature compensation voltage of a mode switching time, using an output switching circuit between said temperature compensation circuit and said first filter circuit, said power control circuit switching said output switching circuit to said first mode when power supply to said temperature compensation circuit is started, and switching said output switching circuit to said second mode when power supply to the temperature compensation circuit is stopped.

30. A method of controlling a temperature compensated oscillator that has a voltage controlled oscillation circuit whose output signal oscillation frequency changes according to supplied voltage, a temperature compensation circuit that outputs temperature compensation voltage for keeping said output signal oscillation frequency constant based on temperature, a voltage control circuit that outputs frequency control voltage for making said output signal oscillation frequency the frequency to be set based on externally supplied frequency control signals, and an adder that outputs said temperature compensation voltage and said frequency control voltage added together, the method comprising:

switching between a first mode where the output voltage follows said temperature compensation voltage, and a second mode where the output voltage is maintained at said temperature compensation voltage of a mode switching time, using an output switching circuit;

removing noise contained in said temperature compensation voltage output via said output switching circuit using a first filter circuit;

removing noise contained in said frequency control voltage using a second filter circuit; and controlling power supply at least to said voltage controlled oscillation circuit and said temperature compensation circuit, respectively, using a power control circuit, said power control circuit switching said output switching circuit to said first mode when power supply to the temperature compensation circuit is started, and switching said output switching circuit to said second mode when power supply to said temperature compensation circuit is stopped.

31. The method of controlling a temperature compensated oscillator described in claim 30, said power control circuit stoping power supply to circuits other than said output switching circuit when power supply to said voltage controlled oscillation circuit and said temperature compensation circuit are stopped.

32. The method of controlling a temperature compensated oscillator described in claim 30, said power control circuit controlling power supply to said voltage controlled oscillation circuit and said temperature compensation circuit based on an externally supplied control signal.

* * * * *